(12) United States Patent
Kim et al.

(10) Patent No.: US 12,543,278 B2
(45) Date of Patent: Feb. 3, 2026

(54) CONNECTOR MODULE AND CONVERTER COMPRISING SAME

(71) Applicant: LG INNOTEK CO., LTD., Seoul (KR)

(72) Inventors: Ki Dong Kim, Seoul (KR); Byung Nam Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 206 days.

(21) Appl. No.: 18/255,257

(22) PCT Filed: Dec. 9, 2021

(86) PCT No.: PCT/KR2021/018691
§ 371 (c)(1),
(2) Date: May 31, 2023

(87) PCT Pub. No.: WO2022/131685
PCT Pub. Date: Jun. 23, 2022

(65) Prior Publication Data
US 2024/0008194 A1    Jan. 4, 2024

(30) Foreign Application Priority Data

Dec. 14, 2020  (KR) ......................... 10-2020-0174850

(51) Int. Cl.
*H05K 5/00*    (2025.01)
(52) U.S. Cl.
CPC ......... *H05K 5/0069* (2013.01); *H05K 5/0047* (2013.01)
(58) Field of Classification Search
CPC ............... H05K 5/0069; H05K 5/0047; H05K 7/14329; H01R 12/515; H01R 12/724;
(Continued)

(56) References Cited

U.S. PATENT DOCUMENTS

| 6,077,095 A | 6/2000 | DelPrete et al. |
| 10,601,156 B2 | 3/2020 | Lappoehn |

(Continued)

FOREIGN PATENT DOCUMENTS

| CN | 210326234 U | 4/2020 |
| JP | 2005-141942 A | 6/2005 |

(Continued)

OTHER PUBLICATIONS

Supplementary European Search Report dated Oct. 4, 2024 in European Application No. 21906989.5.

(Continued)

*Primary Examiner* — Zheng Song

(74) *Attorney, Agent, or Firm* — Saliwanchik, Lloyd & Eisenschenk

(57) ABSTRACT

In a connector module coupled to a printed circuit board including a terminal hole, the connector module comprises: a bracket including a first body and a second body; a bus bar disposed in the bracket and being protruded outside the first body; and a pin disposed in the second body and connected to the bus bar, wherein the bus bar comprises: an upper plate part disposed on an upper surface of the printed circuit board; a connection part bent from one end of the upper plate part and coupled to the terminal hole; and a bent part bent from the other end of the upper plate part and surrounding the side surface of the printed circuit board.

19 Claims, 25 Drawing Sheets

(58) Field of Classification Search
CPC ............ H01R 12/7005; H01R 2201/26; H01R 2105/00; H01R 13/04
See application file for complete search history.

(56) References Cited

U.S. PATENT DOCUMENTS

| | | | |
|---|---|---|---|
| 2004/0082206 A1 | 4/2004 | Chang et al. | |
| 2013/0260579 A1* | 10/2013 | Yamanaka | H01R 12/55 439/83 |
| 2014/0267926 A1 | 9/2014 | Choi | |
| 2022/0247265 A1* | 8/2022 | Seo | H01R 9/24 |
| 2023/0009685 A1* | 1/2023 | Cavallieri | H01R 13/506 |
| 2024/0008194 A1 | 1/2024 | Kim et al. | |
| 2024/0381593 A1* | 11/2024 | Ikegami | H05K 7/14329 |

FOREIGN PATENT DOCUMENTS

| | | |
|---|---|---|
| JP | 2009-230893 A | 10/2009 |
| JP | 2012-146609 A | 8/2012 |
| JP | 2020-124021 A | 8/2020 |
| JP | 2020-187952 A | 11/2020 |
| KR | 10-2015-0052755 A | 5/2015 |
| KR | 20-2017-0003358 U | 9/2017 |
| KR | 10-2019-0051533 A | 5/2019 |
| KR | 10-1989320 B1 | 6/2019 |
| KR | 10-2020-0008905 A | 1/2020 |

OTHER PUBLICATIONS

International Search Report dated Mar. 21, 2022 in International Application No. PCT/KR2021/018691.
Office Action dated Apr. 28, 2025 in Korean Application No. 10-2020-0174850.
Office Action dated Dec. 2, 2025 in Japanese Application No. 2023-535886.
Office Action dated Oct. 8, 2025 in Taiwanese Application No. 110146792.

* cited by examiner

CONNECTOR MODULE AND CONVERTER COMPRISING SAME

CROSS-REFERENCE TO RELATED APPLICATIONS

This application is the U.S. national stage application of International Patent Application No. PCT/KR2021/018691, filed Dec. 9, 2021, which claims the benefit under 35 U.S.C. § 119 of Korean Application No. 10-2020-0174850, filed Dec. 14, 2020, the disclosures of each of which are incorporated herein by reference in their entirety.

TECHNICAL FIELD

The present embodiment relates to a connector module and a converter including same.

BACKGROUND ART

As electric devices of automobiles, engine electric devices (starting device, ignition device, and charging device) and lighting device are common, but in recent years, as vehicles are more electronically controlled, most systems including chassis electric devices are becoming electric and electronic.

Various electric components such as lamps, audio, heaters, and air conditioners installed in automobiles receive power from the battery when the car is stopped and receive power from the generator when driving, and at this time, the power generation capacity of the 14V power system is used as a normal power supply voltage.

Recently, along with the development of the information technology industry, various new technologies (motorized power steering, Internet, and the like) for the purpose of increasing the convenience of automobiles are being adopted to vehicles, and in the future, it is expected that the development of new technologies that can utilize the current automobile system to the maximum will continue.

A hybrid electric vehicle (HEV), regardless of soft or hard type, is equipped with a DC-DC converter for supplying an electric load (12V). In addition, the DC-DC converter, which acts as a generator (alternator) of a general gasoline vehicle, supplies a voltage of 12V for the electric load by reducing the high voltage of the main battery (usually a high-voltage battery of 144V or more).

A DC-DC converter refers to an electronic circuit device that converts DC power of a certain voltage to DC power of another voltage, and is used in various fields such as television sets and automobile electronic products.

The outer appearance of a converter may be formed by the housing. In addition, a connector module electrically connected to a battery or a load may be disposed on an outer surface of the housing. When the connector module is coupled to an external terminal, the converter may receive power from the battery or apply the converted power to the load.

The connector module is provided with a plurality of connector terminals so as to be respectively coupled to a plurality of external terminals having different power values. For example, the number of each of the plurality of external terminals and the plurality of connector terminals may be three. Since each external terminal must be coupled to a connector terminal having the same power value, attention of the operator is needed in the manufacturing process of the converter.

DETAILED DESCRIPTION OF THE INVENTION

Technical Subject

The present embodiment is to provide a connector module that is easy to assemble and that can lower the manufacturing cost by reducing the number of parts and a converter including the same.

Technical Solution

In a connector module coupled to a printed circuit board including a terminal hole, the connector module according to the present embodiment comprises: a bracket including a first body and a second body; a bus bar disposed in the bracket and being protruded outside the first body; and a pin disposed in the second body and connected to the bus bar, wherein the bus bar comprises: an upper plate part disposed on an upper surface of the printed circuit board; a connection part bent from one end of the upper plate part and coupled to the terminal hole; and a bent part bent from the other end of the upper plate part and surrounding the side surface of the printed circuit board.

A coupling groove may be disposed in a region in which the bent part is disposed among the side surfaces of the printed circuit board, and a side surface of the bent part may face an inner surface of the coupling groove.

It may include a first guide part being protruded from the first body and supporting a lower surface of the printed circuit board, and a second guide part being protruded from the first body and supporting an upper surface of the printed circuit board.

In the frame, a guide protrusion being protruded upward is disposed on an upper surface of the first guide part, and the printed circuit board is formed so as to penetrate through the lower surface from an upper surface, so that a guide hole to which the guide protrusion is coupled may be included.

A third guide part being protruded from the first body and supporting a lower surface of the printed circuit board is included, and on an upper surface of the third guide part, an inclined surface having a shape in which the vertical distance to a lower surface of the printed circuit board becomes closer as it travels toward an outer side of the printed circuit board may be disposed.

A guide rib disposed on an outer side of the bus bar and disposed on an upper surface of the first body is included, and a hole may be disposed on a lower surface of the printed circuit board so that the guide rib is coupled thereto.

It may include: a fourth guide part being protruded from the first body and coupled to the printed circuit board, wherein the fourth guide part includes: a guide groove accommodating a side surface of the printed circuit board; an upper region disposed at an upper portion with respect to the guide groove, a lower surface facing an upper surface of the printed circuit board; and a lower region disposed at a lower portion with respect to the guide groove and having an upper surface facing the lower surface of the printed circuit board A fifth guide part being protruded from the first body and supporting the lower surface of the printed circuit board is included, a guide protrusion is disposed on an upper surface of the fifth guide part, the printed circuit board includes a hole to which the guide protrusion is coupled, and an inclined surface may be disposed on an upper surface of the guide protrusion.

A sixth guide part being protruded from the first body and supporting a lower surface of the printed circuit board is included, the sixth guide part is disposed at a lower portion of the bus bar, a guide protrusion being protruded upward is disposed on an upper surface of the sixth guide part, and a guide hole to which the guide protrusion is coupled may be disposed in the printed circuit board.

A converter according to the present embodiment comprises: a housing including a base and a cover disposed on an upper portion of the base; a printed circuit board disposed in the housing and including a terminal hole; and a connector module which is coupled to the printed circuit board and at least a part thereof is disposed in the housing through a hole disposed on a side surface of the housing, wherein the connector module includes: a bracket including a first body disposed in the housing and a second body disposed outside the housing; a bus bar which is disposed in the bracket and at least a portion thereof is protruded toward an outer side of the first body and coupled to the printed circuit board; and a pin disposed in the second body and connected to the bus bar, and wherein the bus bar includes: an upper plate part disposed on an upper surface of the printed circuit board; a connection part bent from one end of the upper plate part and coupled inside the terminal hole; and a bent part bent from the other end of the upper plate part and surrounding a side surface of the printed circuit board.

Advantageous Effects

According to the present invention, since the contact area with a printed circuit board is increased by the shape of the bus bar, there is an advantage in that the bus bar can be firmly fixed on the printed circuit board.

In addition, since the printed circuit board is supported through a plurality of guide parts in the connector module, it is possible to inhibit the bus bar from being arbitrarily separated from the printed circuit board, and there is an advantage in that the number of parts and assembling man-hours for fastening are reduced.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
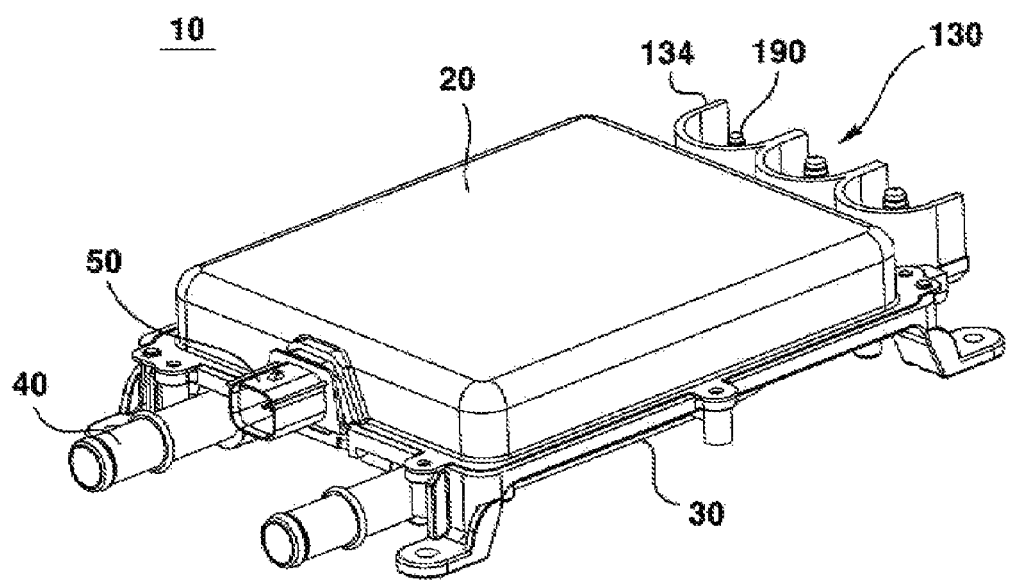
FIG. 1 is a perspective view of a converter according to a first embodiment of the present invention.
Figure 2:
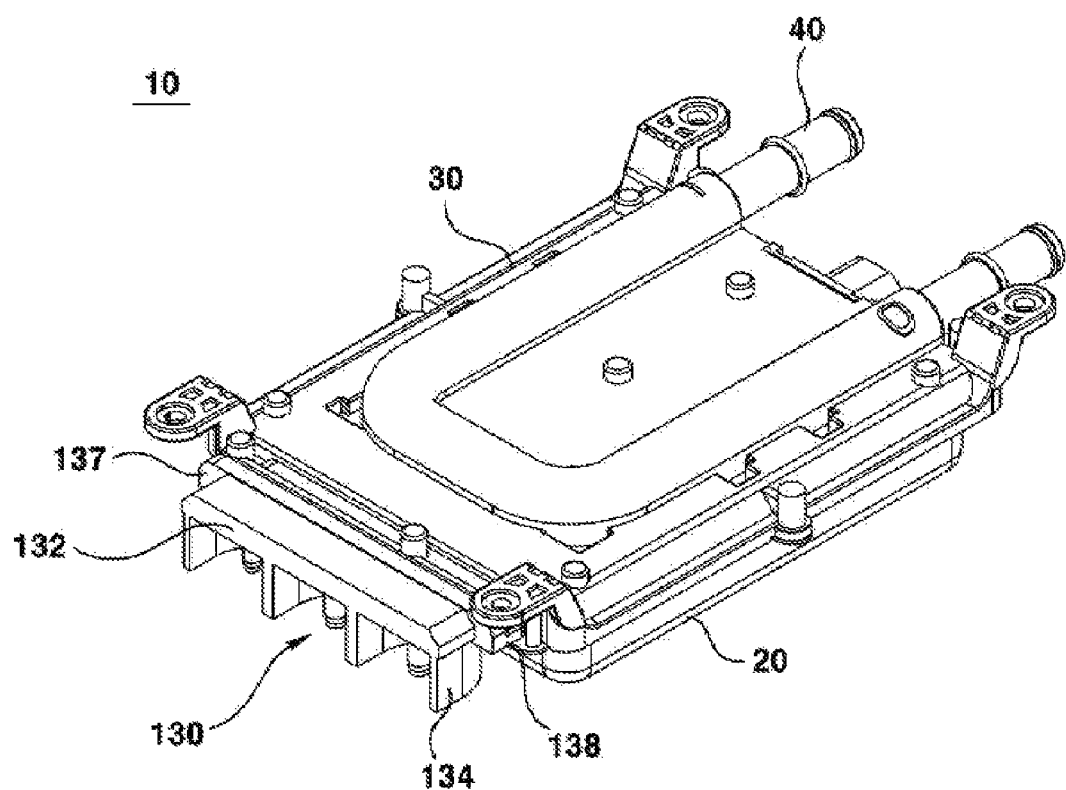
FIG. 2 is a perspective view illustrating a lower surface of a converter according to a first embodiment of the present invention.
Figure 3:
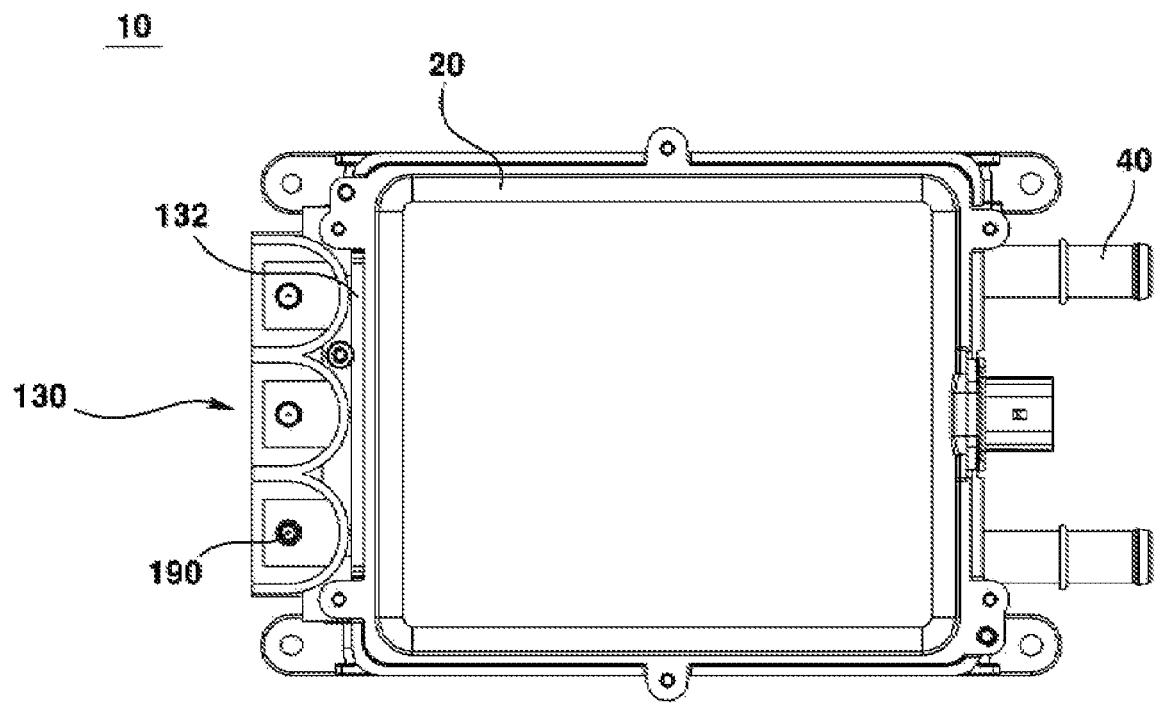
FIG. 3 is a plan view illustrating an upper surface of the converter according to a first embodiment of the present invention.
Figure 4:
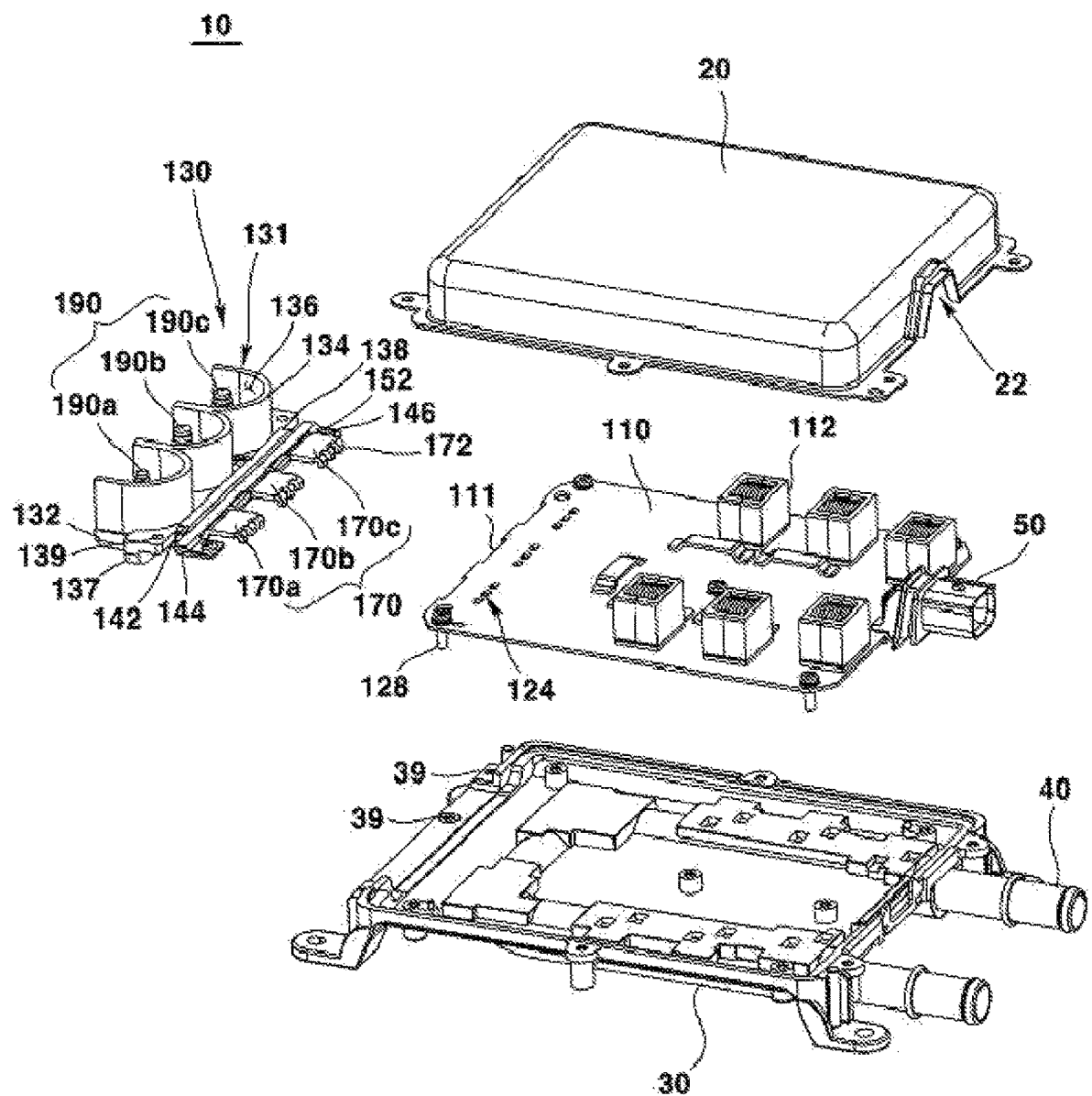
FIG. 4 is an exploded perspective view of a converter according to a first embodiment of the present invention.
Figure 5:
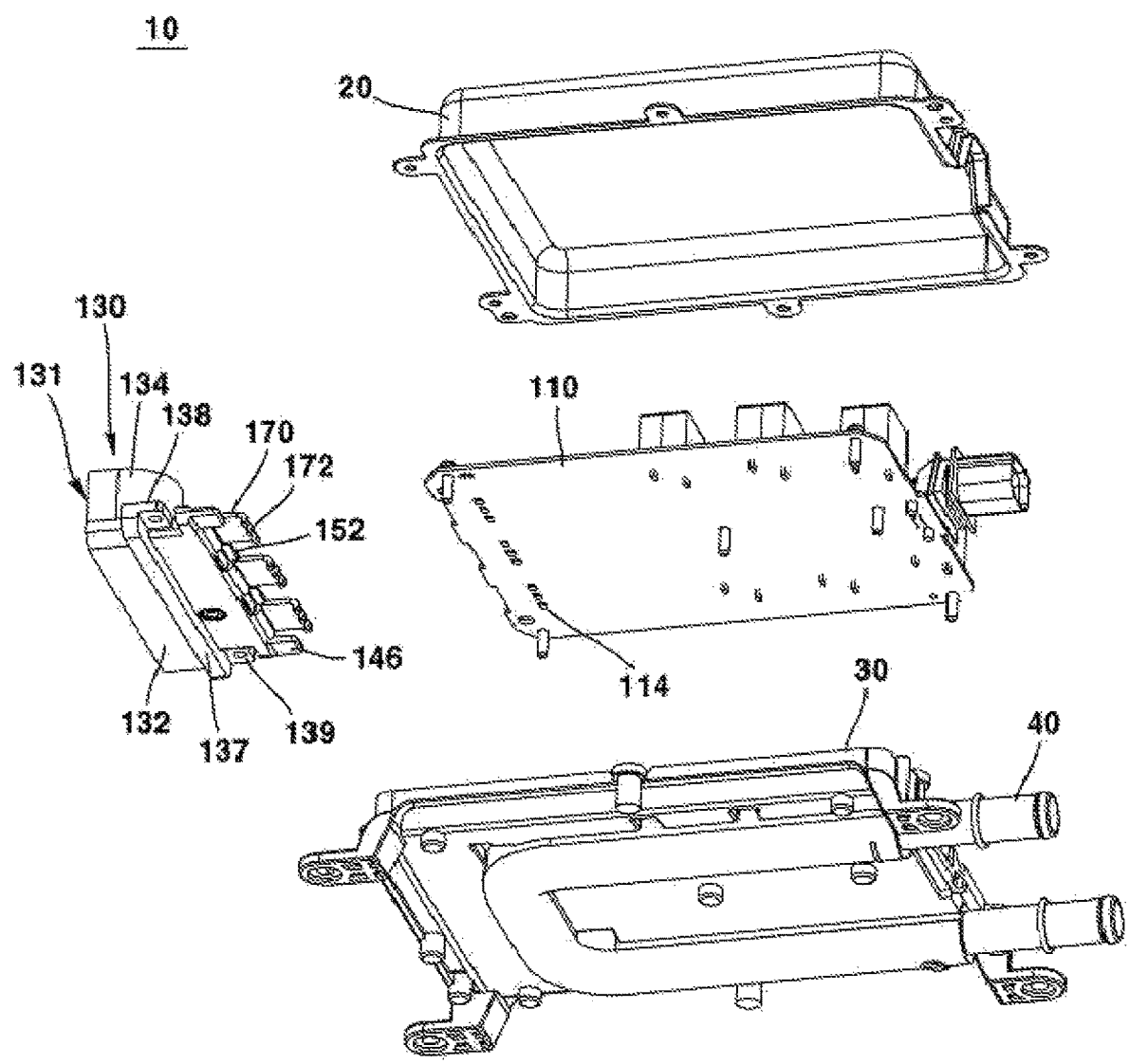
FIG. 5 is an exploded perspective view of FIG. 4 from another angle.
Figure 6:
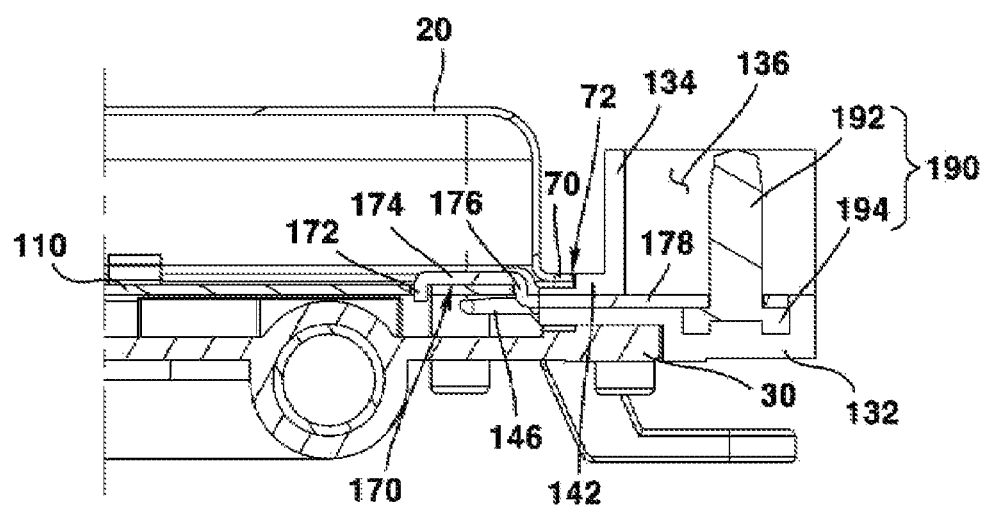
FIG. 6 is a cross-sectional view illustrating a combination of a printed circuit board and a bus bar according to a first embodiment of the present invention.
Figure 7:
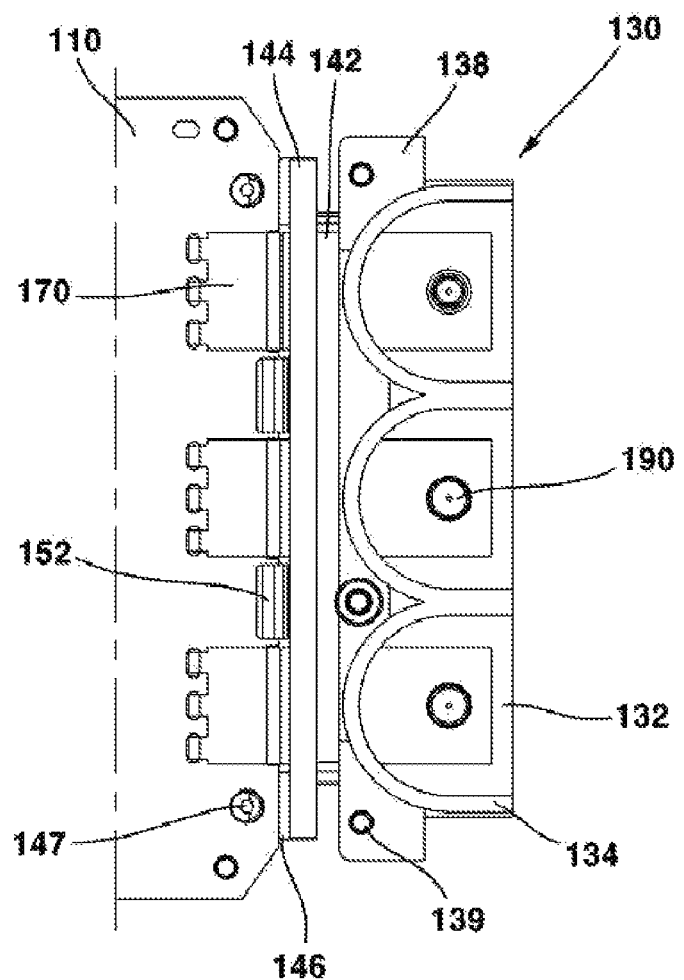
FIG. 7 is a plan view illustrating an upper surface of the connector module according to a first embodiment of the present invention.
Figure 8:
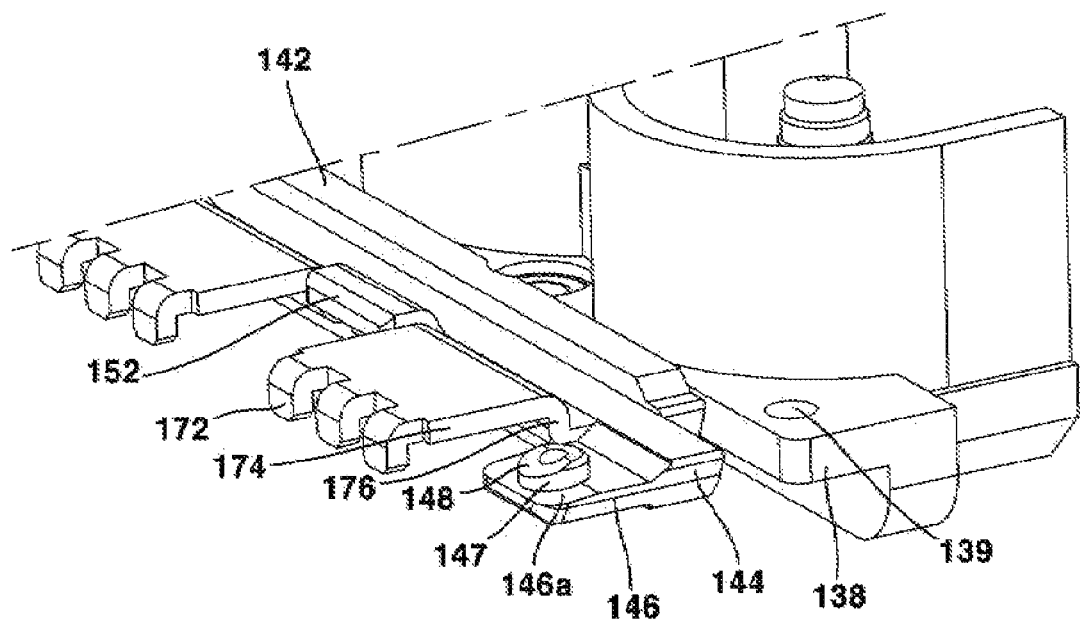
FIG. 8 is a perspective view of a bus bar according to a first embodiment of the present invention.
Figure 9:
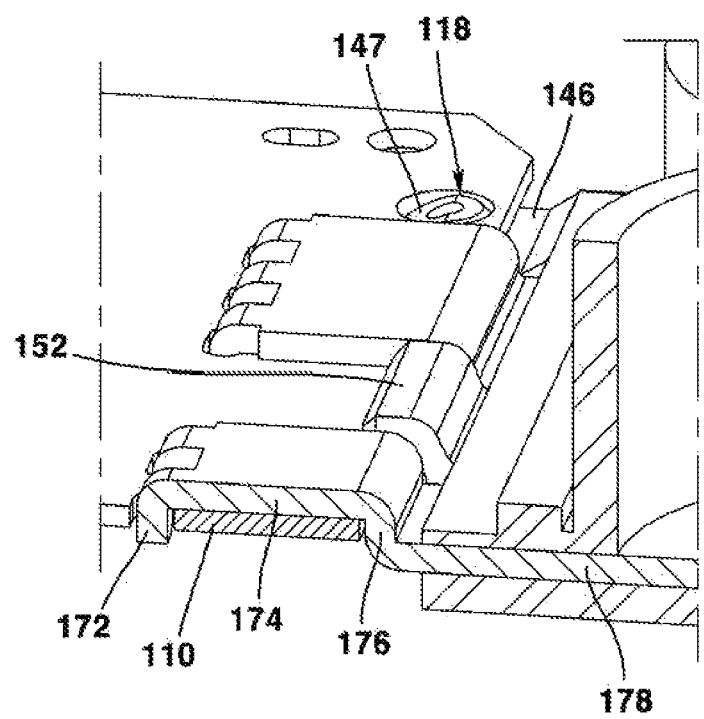
FIG. 9 is a perspective view illustrating a part of a printed circuit board and a connector module in a coupled state cut open according to the first embodiment of the present invention.

FIG. 1 is a perspective view of a converter according to a first embodiment of the present invention, FIG. 2 is a perspective view illustrating a lower surface of a converter according to a first embodiment of the present invention, FIG. 3 is a plan view illustrating an upper surface of the converter according to a first embodiment of the present invention, FIG. 4 is an exploded perspective view of a converter according to a first embodiment of the present invention, FIG. 5 is an exploded perspective view of FIG. 4 from another angle, FIG. 6 is a cross-sectional view illustrating a combination of a printed circuit board and a bus bar according to a first embodiment of the present invention, FIG. 7 is a plan view illustrating an upper surface of the connector module according to a first embodiment of the present invention, FIG. 8 is a perspective view of a bus bar according to a first embodiment of the present invention, and FIG. 9 is a perspective view illustrating a part of a printed circuit board and a connector module in a coupled state cut open according to the first embodiment of the present invention.

Referring to FIGS. 1 to 8, the converter 10 according to the first embodiment of the present invention may have an external shape formed by a housing. An internal space for driving the converter 10 may be formed inside the housing. The housing may be formed by coupling the base 30 and the cover 20. The inner space may be disposed on an inner side formed by the coupling of the base 30 and the cover 20. The cover 20 may be coupled to an upper portion of the base 30. The base 30 and the cover 20 may be coupled to each other through screws (not shown).

A refrigerant pipe 40 may be coupled to the base 30. A space for accommodating at least a portion of the refrigerant pipe 40 may be formed in the base 30. The refrigerant pipe 40 is formed in a pipe shape, and a refrigerant inlet and a refrigerant outlet are disposed at both ends, respectively, and a flow path may be formed therein. Accordingly, the refrigerant introduced through the refrigerant inlet may be circulated along the flow path, and may be discharged through the refrigerant outlet. Accordingly, the driving heat of the electronic components disposed inside the inner space may be dissipated.

At least one electronic component for driving the converter 10 may be disposed inside the housing. For example, a printed circuit board 110, a transformer for voltage regulation, an inductor 112 for obtaining an inductance, and an FET device such as a transistor may be disposed inside the housing. Electronic components such as the transformer, the inductor 112, and the FET device may be disposed on an upper surface and a lower surface of the printed circuit board 110 to be electrically connected to each other.

An external terminal coupling part 50 to which an external terminal is coupled may be disposed on a side surface of the housing. The external terminal coupling part 50 may be electrically connected to the printed circuit board 110. An external terminal (not shown) may be coupled to the external terminal coupling part 50. The external terminal is electrically connected to the converter 10 through the connection to the external terminal coupling part 50, and power may be provided to the converter 10, or an electric signal related to driving of the converter 10 may be transmitted and received. A groove 22 for disposing the external terminal coupling part 50 may be formed on a lower surface of the cover 20 corresponding to the arrangement region of the external terminal coupling part 50.

A connector module 130 may be disposed on a side surface of the housing opposite to the arrangement region of the external terminal coupling part 50. The connector module 130 is disposed on a side surface of the housing and may be exposed to the outside. At least a portion of the connector module 130 is disposed inside the housing, and may be coupled to the printed circuit board 110.

The connector module 130 electrically connects the converter 10 and a battery (not shown), and the converter 10 and a load, and power provided from the battery may be converted in the converter 10. The converted power may be applied to the load. For example, the high voltage power applied from the battery may be converted in the converter 10, and the low voltage power may be applied to the load. Accordingly, a configuration for applying power to the converter 10 through the connector module 130 or a configuration for applying power from the converter 10 may be connected.

However, this is exemplary, and the connector module 130 can be defined to include any configuration being disposed on an outer surface of the housing 10 so that the external terminals related to the driving of the converter 10 are electrically and physically connected thereto.

The connector module 130 may include a bracket 131, a pin 190, and a bus bar 170.

The bracket 131 may form an outer shape of the connector module 130. The bracket 131 may be formed of a plastic material. An arrangement space for the pins 190 and the bus bar 170 may be formed in the bracket 131. At least a portion of the bracket 131 may be disposed on an outer side of the housing, and another portion may be disposed inside the housing. A hole 72 (refer to FIG. 6) may be formed in a side surface of the housing so that the bracket 131 penetrates therethrough. The hole 72 may be disposed between the base 30 and the cover 20. The hole 72 may be formed by coupling the base 30 and the cover 20. At least a portion of the bracket 131 may be inserted into the space inside the housing through the hole 72.

A second screw hole may be formed on a lower surface of the bracket 131 to correspond to the first screw hole formed on the base 30. Accordingly, the bracket 131 and the base 30 may be screw-coupled to each other through screws.

The bracket 131 may include a first body 144 disposed inside the housing and a second body 138 disposed outside the housing. In addition to this, the bracket 131 may include a third body 142 connecting the first body 144 and the second body 138.

The first body 144 may be disposed inside the housing. The first body 144 may be coupled to penetrate through the hole 72. A sealing member 70 may be disposed between the first body 144 and an inner circumferential surface of the hole 72. The sealing member 70 has a ring-shaped cross section, and may be disposed between an outer surface of the first body 144 and an inner surface of the hole 72. The sealing member 70 may be formed of a rubber material. It is possible to inhibit foreign substances from being introduced into the housing through the sealing member 70.

Unlike this, the sealing member 70 may be formed by applying a liquid curing agent between an outer surface of the first body 144 and an inner surface of the hole 72 and curing it.

At least a portion of the first body 144 may be extended into the space inside the housing, and may have a coupling structure with the printed circuit board 110. This will be described later.

The second body 138 may be disposed outside the housing. The second body 138 may have a first screw hole 139 formed to penetrate through a lower surface from the upper surface. In addition, a second screw hole 39 may be formed on an upper surface of the base 30 facing the first screw hole 139. Accordingly, the screw may penetrate through the first screw hole 139 to be screw-coupled to the second screw hole 39 on the base 30. Accordingly, the bracket 131 may be firmly fixed on the base 30. A plurality of screw coupling regions of the bracket 131 and the base 30 may be provided.

On a lower surface of the second body 138, a support part 137 being protruded downward from other regions may be formed. When the connector module 130 is coupled to the housing, an inner surface of the support part 137 may be in contact with a side surface of the base 30.

A terminal coupling part 134 to which an external terminal is coupled may be disposed on the second body 138. A terminal groove 136 having a groove shape may be disposed inside the terminal coupling part 134. The pin 190 may be disposed inside the terminal groove 136. The terminal groove 136 may be partitioned from another region by the terminal coupling part 134. The terminal coupling part 134 may have a partition wall shape that partitions the terminal groove 136 from other regions. A cross-sectional shape of the terminal coupling part 134 may be formed in a semicircular shape. The terminal coupling part 134 may have a bottom surface, and the pin 190 may be disposed to be protruded upward from the bottom surface. A bottom portion 132 may be disposed below the terminal coupling part 134 to support a lower end of the pin 190 by a bottom surface disposed on an upper surface.

The terminal groove 136 may be provided in plurality. For example, the number of the terminal grooves 136 may be three. A plurality of the terminal coupling parts 134 may also be provided to correspond to the number of the plurality of terminal grooves 136. Each of the plurality of terminal grooves 136 may be partitioned from other regions by the terminal coupling part 134.

The third body 142 is disposed between the first body 144 and the second body 138 and may be more protruded upward than other regions. The cross-sectional area of the third body 142 may be larger than that of the first body 144. The length of the third body 142 in an up and down direction may be greater than the length of the first body 144 in an up and down direction. The upper surface of the third body 142 may be disposed to be more stepped upward from the upper surface than the first body 144.

Accordingly, when the connector module 130 is coupled to the housing, the coupling region of the bracket 131 inside the housing may be guided by the third body 142. That is, the insertion of the first body 144 into the hole 72 may be performed until an inner surface of the third body 142 and a side surface of the housing come into contact with each other. At least a portion of the sealing member 70 may be in contact with an inner surface of the third body 142.

The connector module 130 may include pins 190. The pin 190 may be electrically connected to an external terminal. The pin 190 may be coupled to the bus bar 170. The pin 190 may be electrically connected to the bus bar 170. The pin 190 may be formed of a metal material.

The pin 190 may include a head part 194 and a terminal part 192. The head part 194 may be disposed on an upper surface of the bottom part 132, and the terminal part 192 may be extended upwardly from an upper surface of the head part 194. An upper end of the pin 190 may be disposed lower than an upper end of the terminal coupling part 134. A region in which the head part 194 is disposed among an upper surface of the bottom part 132 may have a groove shape that is more recessed downward than other regions.

The pins 190 are provided in plurality, and may be disposed in each of the plurality of terminal grooves 136. The plurality of pins 190 may include a first pin 190a, a second pin 190b, and a third pin 190c. The plurality of pins 190 may be disposed in each of the plurality of terminal grooves 136 and may not be electrically connected to each other. Voltages of different magnitudes may be applied to the plurality of pins 190. For example, a voltage of 12V may be applied to the first pin 190a, a voltage of a ground region may be applied to the second pin 190b, and a voltage of 48V may be applied to the third pin 190c.

The connector module 130 may include a bus bar 170. One end of the bus bar 170 may be coupled to the pin 190, and the other end may be coupled to the printed circuit board 110. An external terminal and the converter 10 including the printed circuit board 110 may be electrically connected through the bus bar 170 and the pin 190.

A space may be formed inside the bracket 131 so that the bus bar 170 is coupled thereto. One end of the bus bar 170 may be coupled to the pin 190, and may be extended inside the housing penetrating through the second body 138, the third body 142, and the first body 144. The arrangement region of the bus bar 170 inside the bracket 131 is formed compactly, and it is possible to inhibit the bus bar 170 from arbitrarily being flowing. The bus bar 170 may be formed of a metal material, and may be integrally formed with the bracket 131 by insert injection.

The bus bar 170 may be provided in plurality. The plurality of bus bars 170 may include a first bus bar 170a connected to the first pin 190a, a second bus bar 170b connected to the second pin 190b, and a third bus bar 170c connected to the third pin 190c. The first to third bus bars 170a, 170b, and 170c may be disposed to be spaced apart from one another. Voltages of different magnitudes may be applied to the first to third bus bars 170a, 170b, and 170c corresponding to the first to third pins 190a, 190b, and 190c.

The bus bar 170 may have a region bent at least once or more. In detail, the bus bar 170 may include a first region and a second region 178. The second region 178 may be accommodated inside the bracket 131, and the first region may be protruded toward an outer side of the bracket 131 to be disposed inside the housing. The first region and the second region 178 may be formed as one body.

At least a portion of the second region 178 may be disposed inside the terminal groove 136. At least a portion of the second region 178 may be disposed on a bottom surface of the terminal groove 136. A hole penetrating through a lower surface from an upper surface may be formed in the second region 178 disposed inside the terminal groove 136. The hole may be coupled to the terminal part 192 of the pin 190 to penetrate therethrough. Accordingly, the pin 190 and the bus bar 170 may be electrically connected to each other.

The first region may be coupled to the printed circuit board 110. The first region may be called a printed circuit board coupling part in that it is coupled to the printed circuit board 110, and the second region 178 may be called a pin coupling part in that it is coupled to the pin 190.

The first region is protruded from an outer side of the bracket 131 and may be coupled to the printed circuit board 110. The first region may include: an upper plate part 174 disposed on the printed circuit board 110; a connection part 172 bent downward from one end of the upper plate part 174; and a bent part 176 bent downward from the other end of the upper plate part 174 to connect the other end of the upper plate part 174 and the second region 178. By the bent part 176, the upper plate part 174 may be disposed to be stepped upward with respect to the second region 178. The connection part 172 and the bent part 176 may be disposed to be parallel to each other. The upper plate part 174 may be disposed to be parallel to the second region 178. The lower surface of the upper plate part 174 may be spaced apart from an upper surface of the printed circuit board 110 by a predetermined distance, or the lower surface may be in contact with the upper surface of the printed circuit board 110.

The printed circuit board 110 penetrates through a lower surface from an upper surface, and a terminal hole 114 to which the connection part 172 is coupled may be formed. For example, the number of the connection parts 172 may be three based on a single bus bar 170, and the number of the terminal holes 114 may also be three corresponding to the number of the connection parts 172. The connection part 172 may be soldered inside the terminal hole 114. By coupling the connection part 172 and the terminal hole 114, the bus bar 170, the first printed circuit board 110, and the pin 190 may be electrically connected to one another.

In summary, in the first region, the bent part 176 is disposed in a way that an inner surface faces a side surface of the printed circuit board 110, and a lower surface of the upper plate part 174 is disposed to face an upper surface of the printed circuit board 110, so that the connection part 172 may be coupled to the terminal hole 114. Accordingly, as the contact area with the printed circuit board 110 increases, the bus bar 170 may be firmly fixed on the printed circuit board 110.

Meanwhile, a coupling groove 111 that is more recessed inward than other regions may be formed on a side surface of the printed circuit board 110. The coupling groove 111 corresponds to an arrangement region of the bus bar 170 and may accommodate at least a portion of the bent part 176. An inner surface of the bent part 176 may be in contact with a bottom surface of the coupling groove 111. Accordingly, the bus bar 170 may be coupled more to an inner side of the printed circuit board 110, and the contact area with the printed circuit board 110 may increase. In addition, since both side surfaces of the bent part 176 are supported by an inner surface of the coupling groove 111, there is an advantage that the bus bar 170 can be firmly fixed inside the coupling groove 111.

Hereinafter, a coupling structure of the connector module 130 and the printed circuit board 110 will be described.

As described above, the bus bar 170 has a coupling structure with the printed circuit board 110 through the bent part 176, the upper plate part 174, and the connection part 172.

Meanwhile, in order to firmly fix the printed circuit board 110 and the connector module 130, the connector module 130 may include a first guide part 146 and a second guide part 152. The first guide part 146 and the second guide part 152 are respectively disposed to be protruded inward from the first body 144, and may support an upper surface or a lower surface of the printed circuit board 110. The first guide part 146 and the second guide part 152 may be formed as one body with the bracket 131.

The first guide part 146 may be protruded inward from an inner surface of the first body 144 facing the side surface of the printed circuit board 110, and may be disposed at a lower portion of the printed circuit board 110. The first guide part 146 may be provided in plurality, and may be disposed on an outer side of the plurality of bus bars 170. The plurality of first guide parts 146 may be respectively disposed on both edges of the first body 144.

An upper surface of the first guide part 146 may face a lower surface of the printed circuit board 110. A portion among the upper surface of the first guide part 146 may be spaced apart from a lower surface of the printed circuit board 110 by a predetermined distance. Another portion among the upper surface of the first guide part 146 may be in contact with the lower surface of the printed circuit board 110. An inclined surface 146a having a shape in which the thickness of the first guide part 146 becomes thinner as it travels toward the inner side thereof may be formed on the upper surface of the first guide part 146. Accordingly, when the connector module 130 and the printed circuit board 110 are coupled, the first guide part 146 may easily slide along the lower surface of the printed circuit board 110.

A guide protrusion 147 being protruded upward may be formed on an upper surface of the first guide part 146. The guide protrusion 147 may be disposed approximately at the center of the first guide part 146. An inclined surface 148 having a different height from that of other regions is formed on an upper surface of the guide protrusion 147, and can be easily slid when coupled with the printed circuit board 110 through the inclined surface 148. The cross-sectional shape of the guide protrusion 147 may be circular.

The printed circuit board 110 is formed to penetrate through a lower surface from an upper surface, and when the connector module 130 is coupled, a guide hole 118 to which the guide protrusion 147 is coupled may be formed. Specifically, when the connector module 130 and the printed circuit board 110 are coupled, as the first guide part 146 slidingly moved along a lower surface of the printed circuit board 110, the guide protrusion 147 may be inserted into the guide hole 118. Therefore, due to the coupling structure between the guide protrusion 147 and the guide hole 118 inside the plurality of first guide parts 146, the connector module 130 is inhibited from being flowing in a direction parallel to the printed circuit board 110, and the coupling state with the printed circuit board 110 may be firmly maintained.

The second guide part 152 may be protruded inward from the first body 144 and may be disposed at an upper portion of the printed circuit board 110. The second guide part 152 may be provided in plurality, and may be disposed between the plurality of first guide parts 146. For example, the second guide part 152 may be disposed between the first bus bar 170a and the second bus bar 170b and between the second bus bar 170b and the third bus bar 170c. A lower surface of the second guide part 152 may be in contact with an upper surface of the printed circuit board 110 or may be spaced apart from each other by a predetermined distance. An upper surface of the second guide part 152 may be disposed above an upper surface of the upper plate part 174. Meanwhile, an inclined surface or a curved surface for easy sliding of the printed circuit board 110 may be formed on a lower surface of the second guide part 152.

Accordingly, since a lower surface of the printed circuit board 110 is supported by the first guide part 146 and an upper surface of the printed circuit board 110 is supported by a lower surface of the second guide part 152, the connector module 130 is inhibited from being flowing in an up and down direction which is perpendicular to the printed circuit board 110, and the coupling state with the printed circuit board 110 may be firmly fixed.

Meanwhile, the converter 10 first combines the printed circuit board 110 and the connector module 130, and then combines the printed circuit board 110 and the connector 130 on the base 30, may be assembled by coupling the cover 20 and the base 30.

Figure 10:
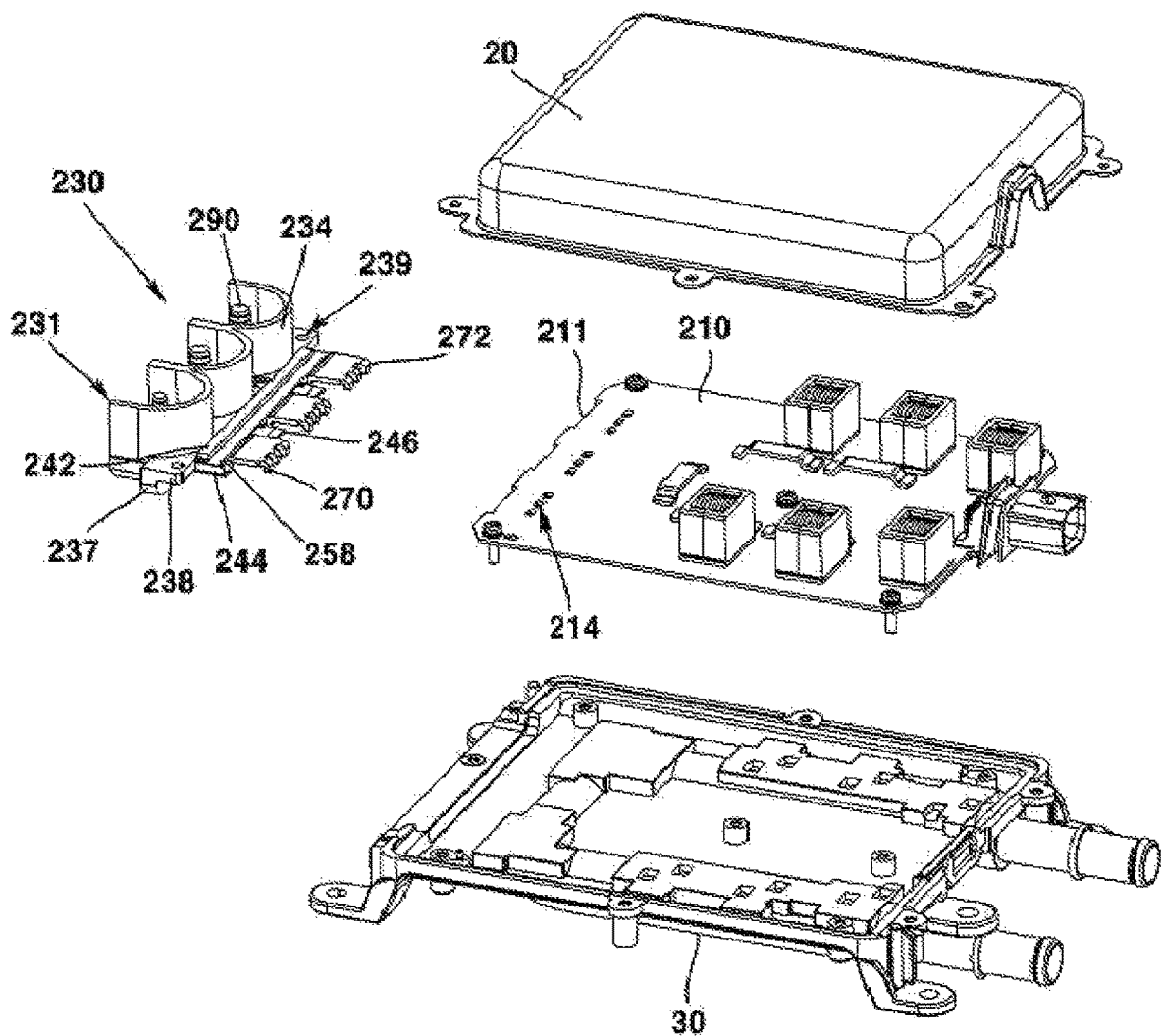
FIG. 10 is an exploded perspective view of a converter according to a second embodiment of the present invention.
Figure 11:
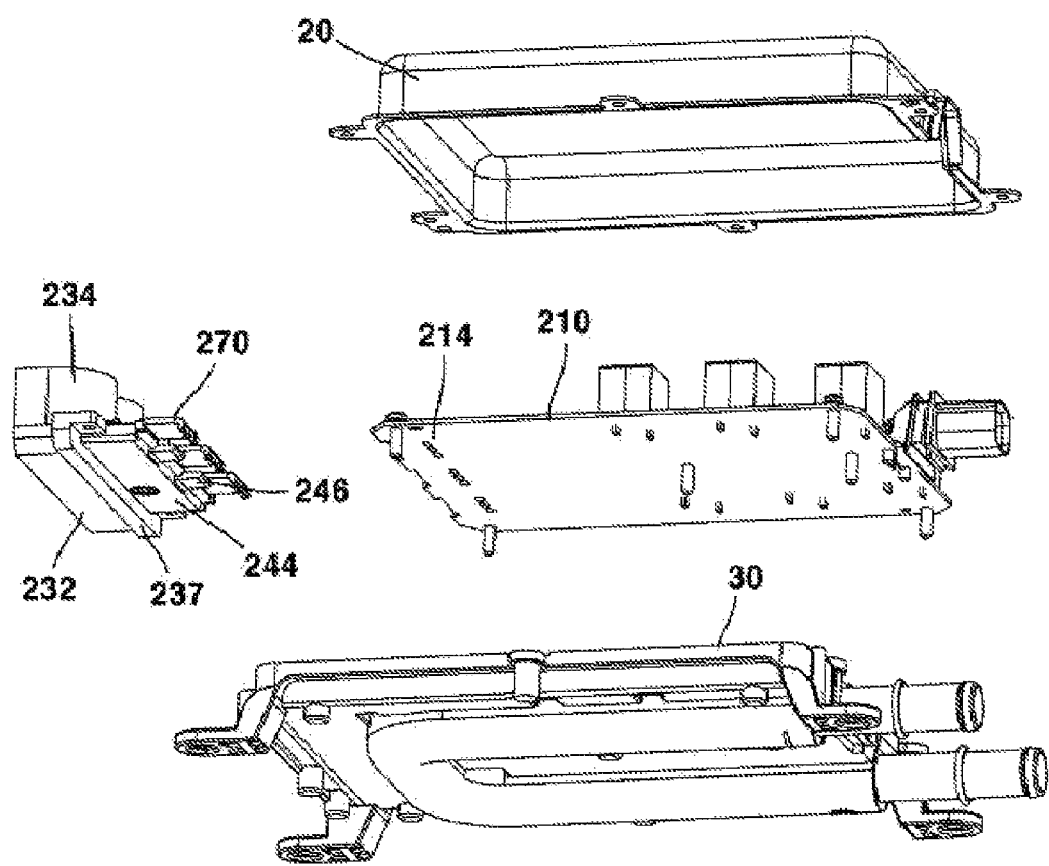
FIG. 11 is an exploded perspective view illustrating FIG. 10 from another angle.
Figure 12:
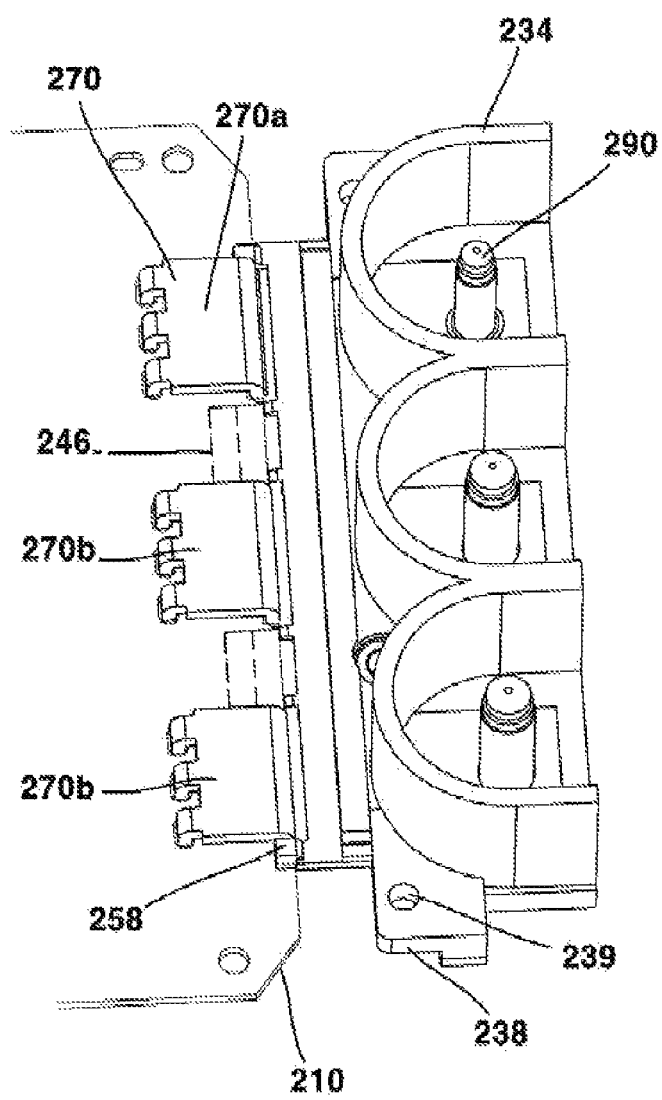
FIG. 12 is a perspective view illustrating a coupling state between a connector module and a printed circuit board according to a second embodiment of the present invention.
Figure 13:
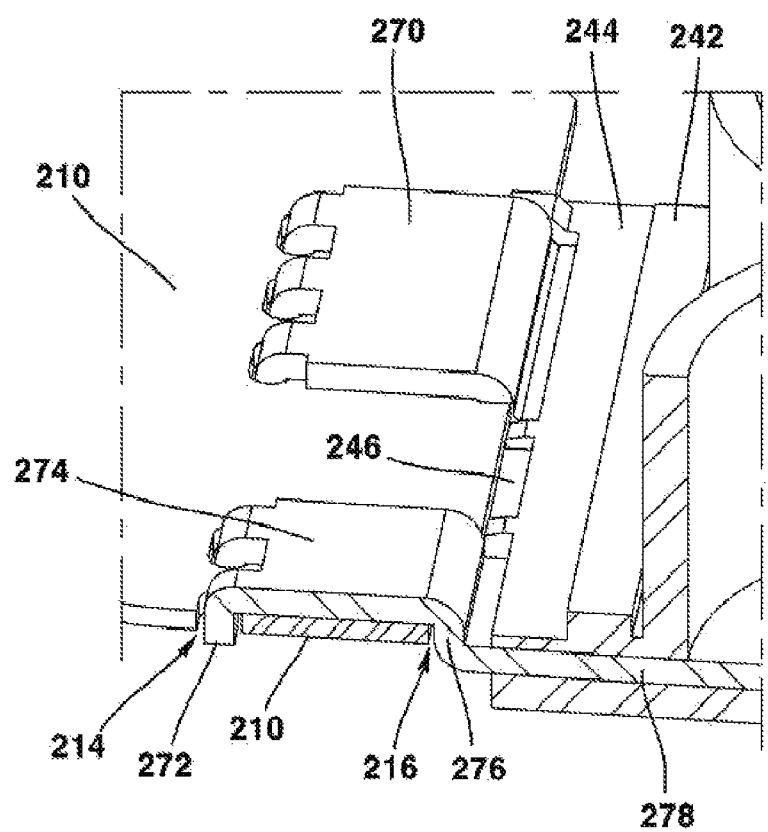
FIG. 13 is a perspective view illustrating a region of FIG. 12 by cutting it.
Figure 14:
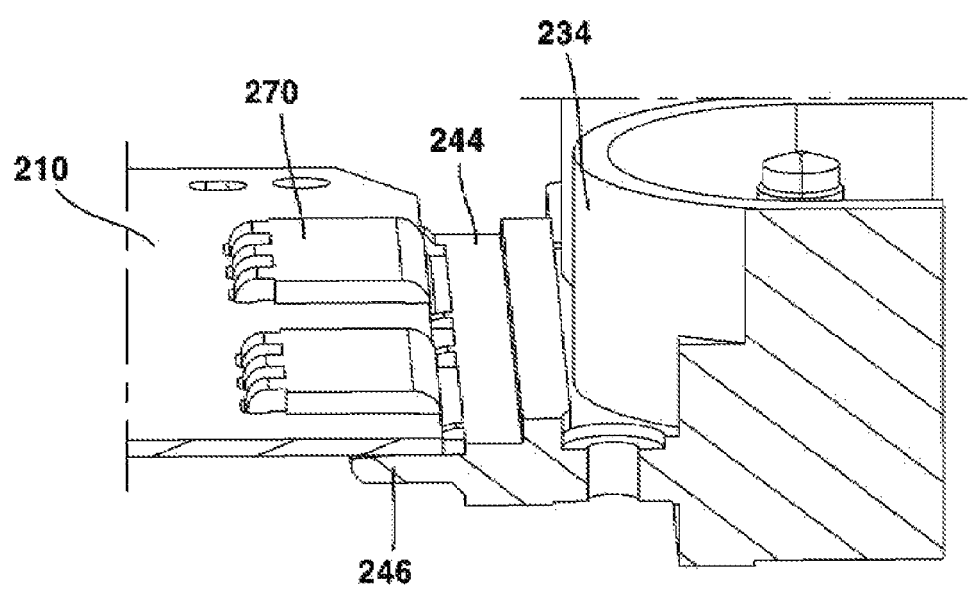
FIG. 14 is a perspective view illustrating another region of FIG. 12 by cutting it.

FIG. 10 is an exploded perspective view of a converter according to a second embodiment of the present invention, FIG. 11 is an exploded perspective view illustrating FIG. 10 from another angle, FIG. 12 is a perspective view illustrating a coupling state between a connector module and a printed circuit board according to a second embodiment of the present invention, FIG. 13 is a perspective view illustrating a region of FIG. 12 by cutting it, and FIG. 14 is a perspective view illustrating another region of FIG. 12 by cutting it.

In the present embodiment, other parts are the same as in the first embodiment, but there is a difference in the coupling structure of the connector module and the printed circuit board. Therefore, in the following, only the characteristic parts of the present embodiment will be described, and in the remaining parts, the description of the first embodiment will be cited.

Referring to FIGS. 10 to 14, the connector module 230 according to s present embodiment may include a bracket 231, a first body 244, and a second body 238. In addition, the bus bar 270 may form a coupling structure with the printed circuit board 210 through the bent part 276, the upper plate part 274, and the connection part 272. Meanwhile, it is also the same as the first embodiment in that a coupling groove 211 for coupling the bus bar 270 is formed on a side surface of the printed circuit board 210.

For a firm fixation between the printed circuit board 210 and the connector module 230, the connector module 230 may include a third guide part 246. The third guide part 246 is disposed to be protruded inward from the first body 244, and may support a lower surface of the printed circuit board 210. The third guide part 246 may be formed integrally with the bracket 231. An upper surface of the third guide part 246 may be in contact with a lower surface of the printed circuit board 210 or may be spaced apart from the lower surface of the printed circuit board 210 by a predetermined distance.

On an upper surface of the third guide part 246, an inclined surface having a shape in which the vertical distance to a lower surface of the printed circuit board 210 increases as it travels toward the outer side of the printed circuit board 210 may be formed. In addition, two or more step surfaces having different heights may be disposed on an upper surface of the third guide part 246. Accordingly, when the connector module 230 and the printed circuit board 210 are coupled, the third guide part 246 may be easily slidably moved to a lower surface of the printed circuit board 210.

The third guide part 246 is provided in plurality and may be disposed between the plurality of bus bars. For example, the plurality of third guide parts 246 may be disposed between the first bus bar 270a and the second bus bar 270b and between the second bus bar 270b and the third bus bar 270c, respectively.

Through the third guide part 246, the connector module 230 is inhibited from being flowing in a direction perpendicular to the printed circuit board 210, and the coupled state with the printed circuit board 210 can be firmly fixed.

Meanwhile, a guide rib 258 may be additionally disposed on an upper surface of the first body 244 facing a lower surface of the printed circuit board 210. The region where the guide rib 258 of the first body 244 is formed may be protruded more toward the outer side than the other regions. The guide rib 258 may be disposed on both edges of the first body 244, and may be disposed on an outer side of the bus bar 270.

In addition, a hole may be formed in the printed circuit board 210 so that the guide rib 258 is coupled thereto. When the connector module 230 is coupled, the guide rib 258 may be coupled to the hole. Accordingly, the coupling state between the connector module 230 and the printed circuit board 210 may be more firmly maintained.

Figure 15:
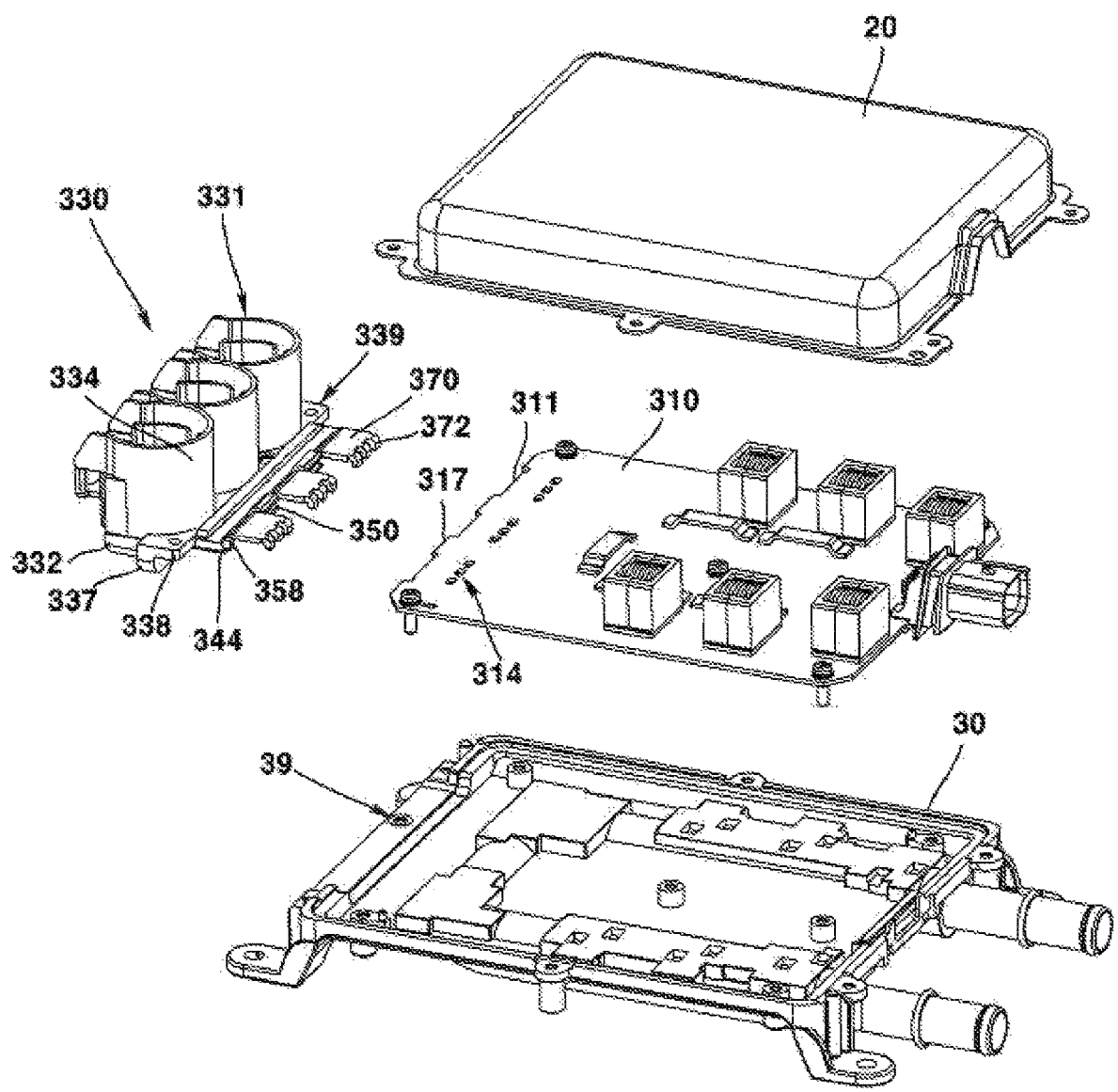
FIG. 15 is an exploded perspective view of a converter according to a third embodiment of the present invention.
Figure 16:
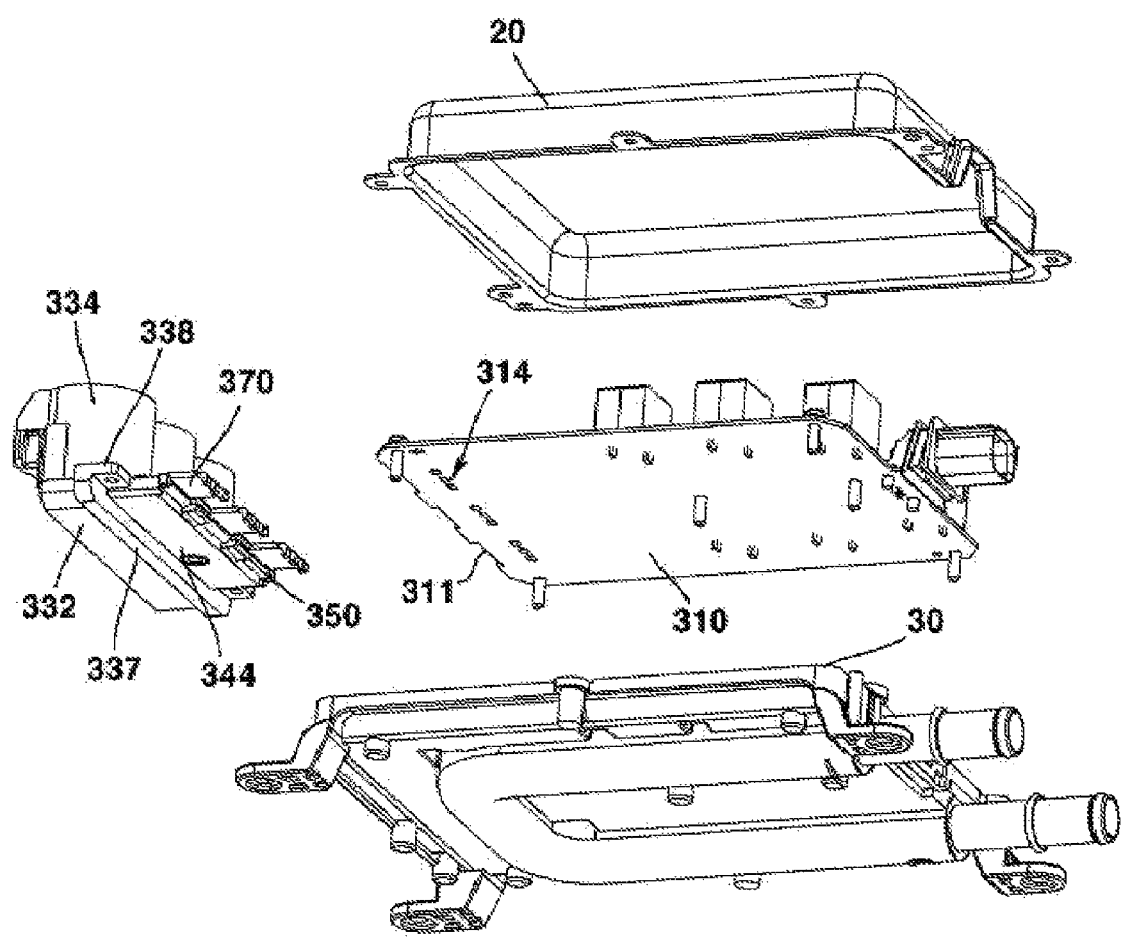
FIG. 16 is an exploded perspective view of FIG. 15 from another angle.
Figure 17:
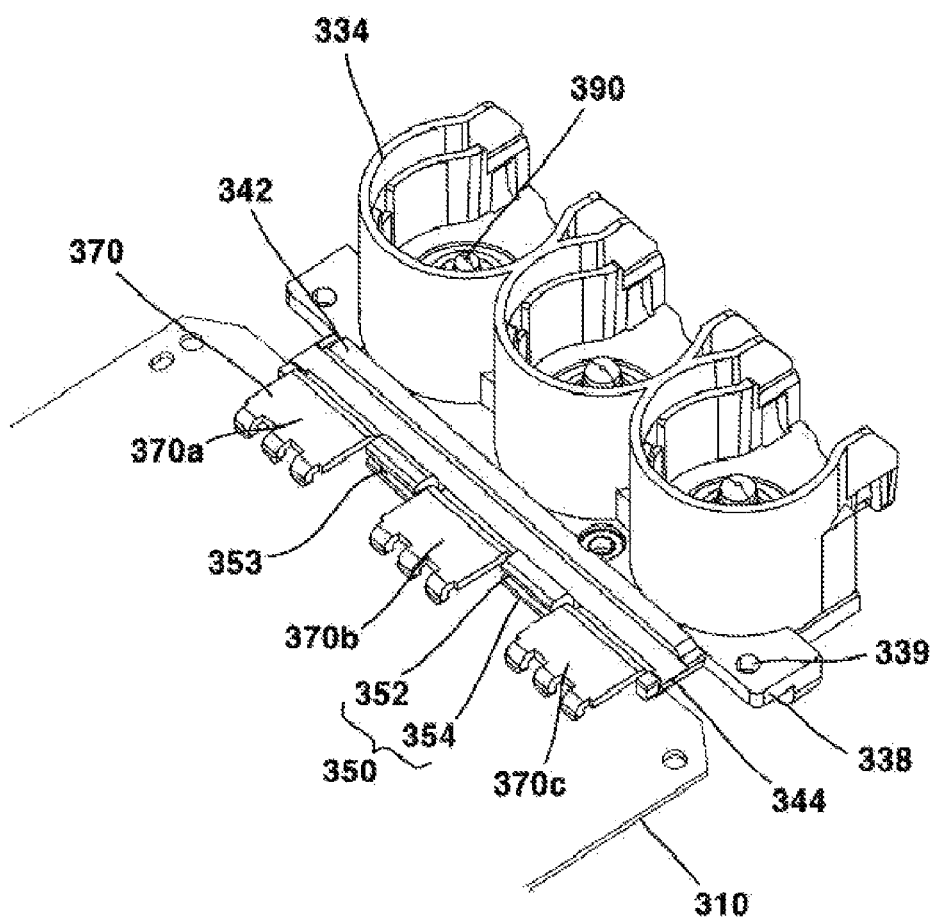
FIG. 17 is a perspective view illustrating a coupling state between a connector module and a printed circuit board according to a third embodiment of the present invention.
Figure 18:
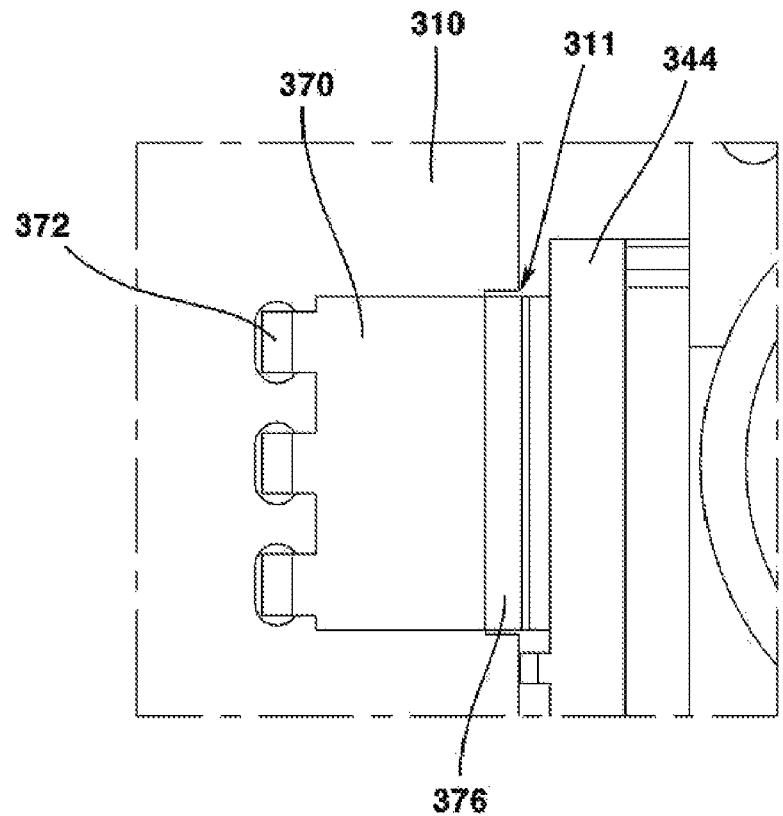
FIG. 18 is a plan view illustrating a combination of a printed circuit board and a bus bar according to a third embodiment of the present invention.
Figure 19:
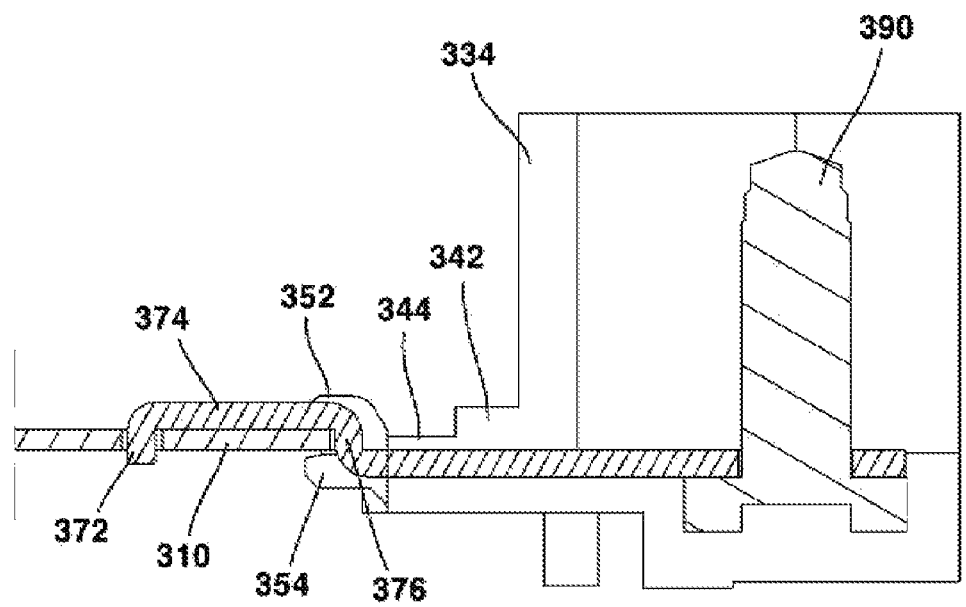
FIG. 19 is a cross-sectional view illustrating an arrangement structure of a bus bar in connector module according to a third embodiment of the present invention.
Figure 20:
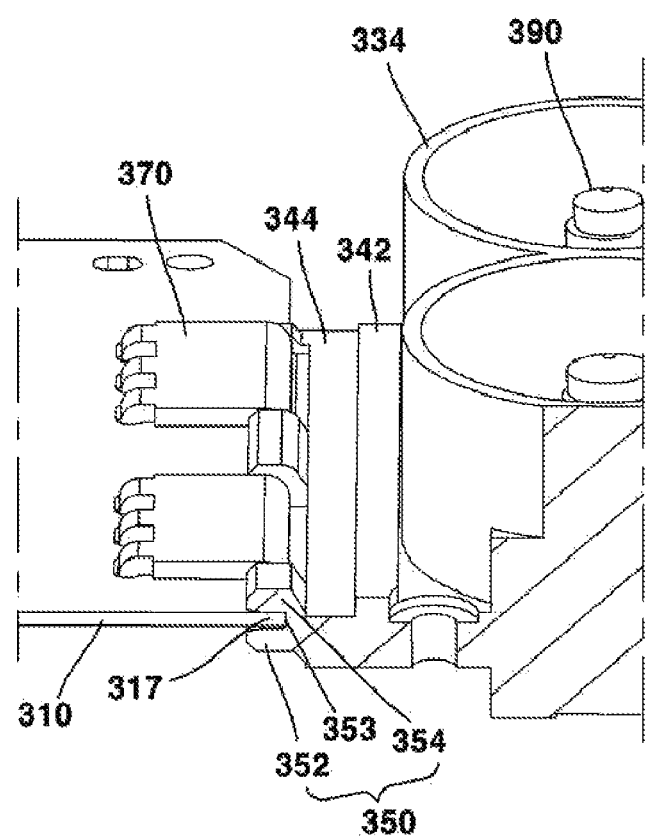
FIG. 20 is a perspective view illustrating a part of a connector module and a printed circuit board coupled to each other in which a portion thereof is cut open according to a third embodiment of the present invention.

FIG. 15 is an exploded perspective view of a converter according to a third embodiment of the present invention, FIG. 16 is an exploded perspective view of FIG. 15 from another angle, FIG. 17 is a perspective view illustrating a coupling state between a connector module and a printed circuit board according to a third embodiment of the present invention, FIG. 18 is a plan view illustrating a combination of a printed circuit board and a bus bar according to a third embodiment of the present invention, FIG. 19 is a cross-sectional view illustrating an arrangement structure of a bus bar in a connector module according to a third embodiment of the present invention, and FIG. 20 is a perspective view illustrating a part of a connector module and a printed circuit board coupled to each other in which a portion thereof is cut open according to a third embodiment of the present invention.

In the present embodiment, other parts are the same as in the first embodiment, but there is a difference in the coupling structure of the connector module and the printed circuit board. Therefore, in the following, only the characteristic parts of the present embodiment will be described, and in the remaining parts, the description of the first embodiment will be cited.

Referring to FIGS. 15 to 20, the connector module 330 according to the present embodiment may also include a bracket 331, a first body 344, and a second body 338. In addition, the bus bar 370 may form a coupling structure with the printed circuit board 310 through the bent part 376, the upper plate part 374, and the connection part 372.

Meanwhile, it is also the same as in the first embodiment in that a coupling groove 311 for coupling the bus bar 370 is formed on a side surface of the printed circuit board 310. Accordingly, as illustrated in FIG. 18, at least a portion of the bent part 376 is disposed in the coupling groove 311, and a side surface of the bent part 376 may be supported by an inner surface of the coupling groove 311. Accordingly, it has been described in the first embodiment that the coupling force between the bus bar 370 and the printed circuit board 310 can be improved.

In the present embodiment, for a firm fixation between the printed circuit board 310 and the connector module 330, the connector module 330 may include a fourth guide part 350. The fourth guide part 350 is disposed to be protruded inward from the first body 344, and may support a lower surface of the printed circuit board 310. The fourth guide part 350 may be formed as one body with the bracket 331. The fourth guide part 350 may support a side surface of the printed circuit board 310. The fourth guide part 350 may accommodate a portion of a side surface of the printed circuit board 310.

In detail, the coupling groove 311 is formed on a side surface of the printed circuit board 310, and a plurality of the coupling grooves 311 may also be provided by the plurality of bus bars 370. Accordingly, the coupling portion 317 defined by the side surface of the printed circuit board 310 may be disposed between the adjacent coupling grooves 311. The fourth guide part 350 may be coupled to the coupling part 317 to support an upper surface of the coupling part 317, a side surface of the coupling part 317, and a lower surface of the coupling part 317.

The fourth guide part 350 is provided in plurality, and may be disposed to be spaced apart from each other. The fourth guide part 350 may be disposed between the first bus bar 370a and the second bus bar 370b and between the second bus bar 370b and the third bus bar 370c.

On a side surface of the fourth guide part 350 facing the printed circuit board 310, a guide groove 353 that is more recessed than other regions may be formed. The fourth guide part 350 may receive at least a portion of the printed circuit board 310 through the guide groove 353. The coupling part 317 may be disposed inside the guide groove 353. The fourth guide part 350 may be partitioned into an upper region 354 and a lower region 352 by the guide groove 353. A lower surface of the upper region 354 may support an upper surface of the printed circuit board 310, and an upper surface of the lower region 352 may support a lower surface of the printed circuit board 310. The length of the guide groove 353 in an up and down direction may correspond to the thickness of the printed circuit board 310 or may be formed to be larger.

According to the structure as described above, through the fourth guide part 350, the connector module 330 is inhibited from being flowing in a direction perpendicular to the printed circuit board 310, and the coupling state with the printed circuit board 310 may be firmly maintained.

Meanwhile, even in the present embodiment, by forming the guide rib 258 and the hole coupling structure of the second embodiment, it is possible to reinforce the coupling strength between the printed circuit board 310 and the connector module 330.

Figure 21:
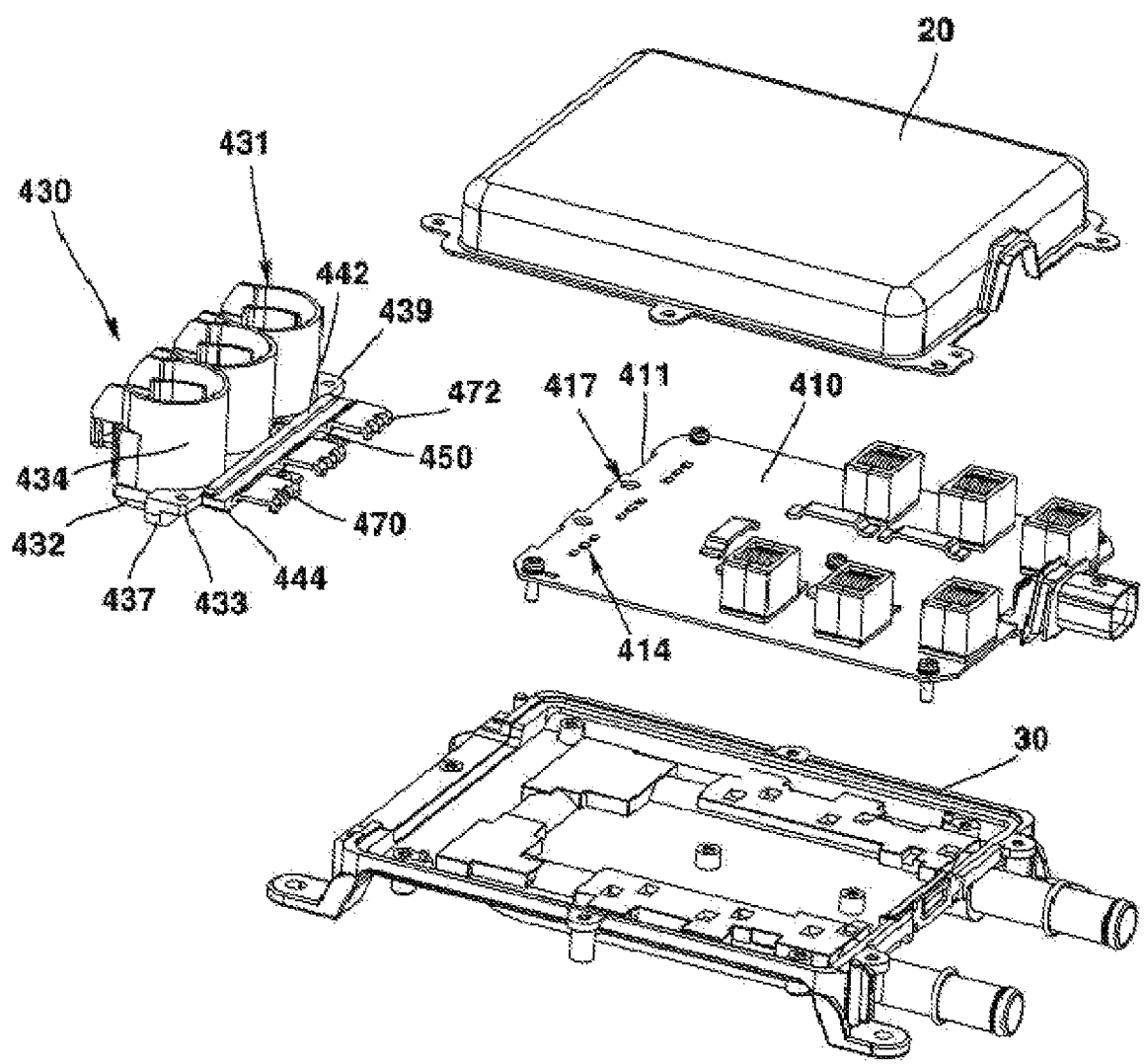
FIG. 21 is an exploded perspective view of a converter according to a fourth embodiment of the present invention.
Figure 22:
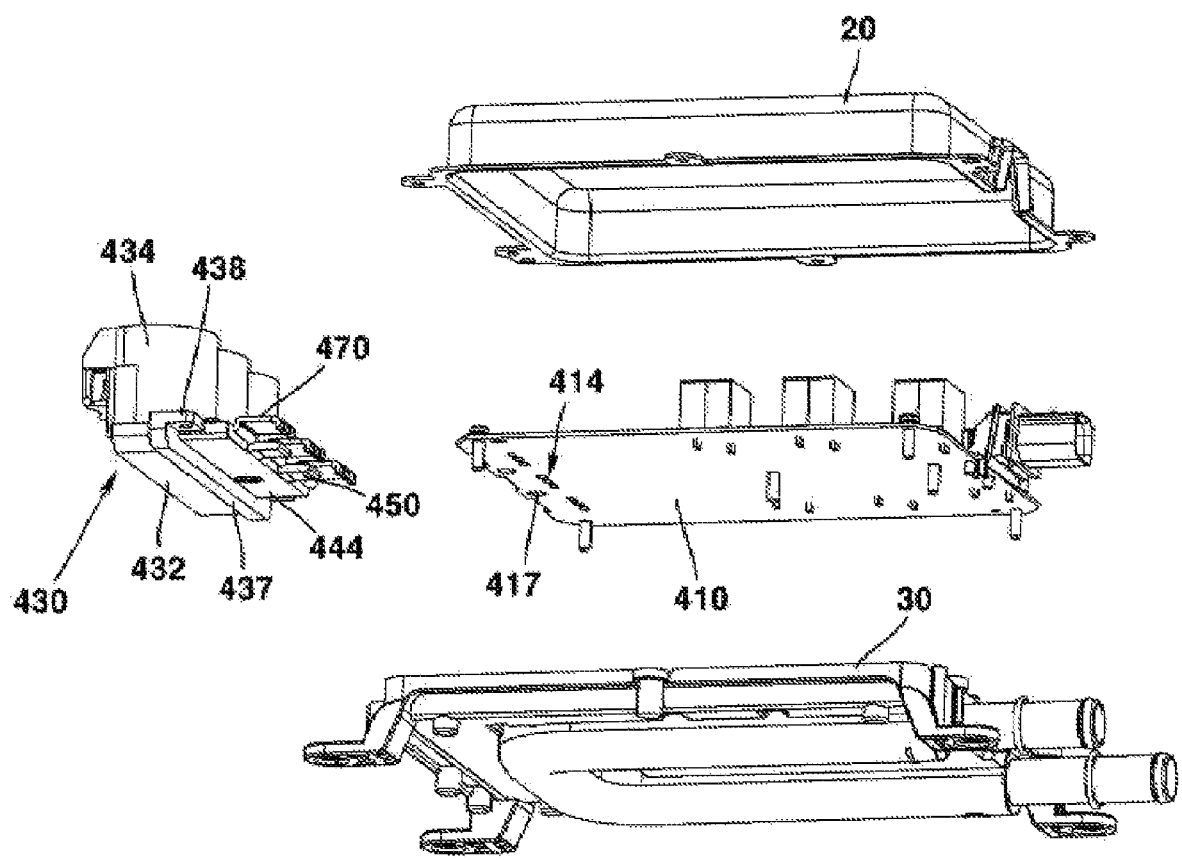
FIG. 22 is an exploded perspective view of FIG. 21 from another angle.
Figure 23:
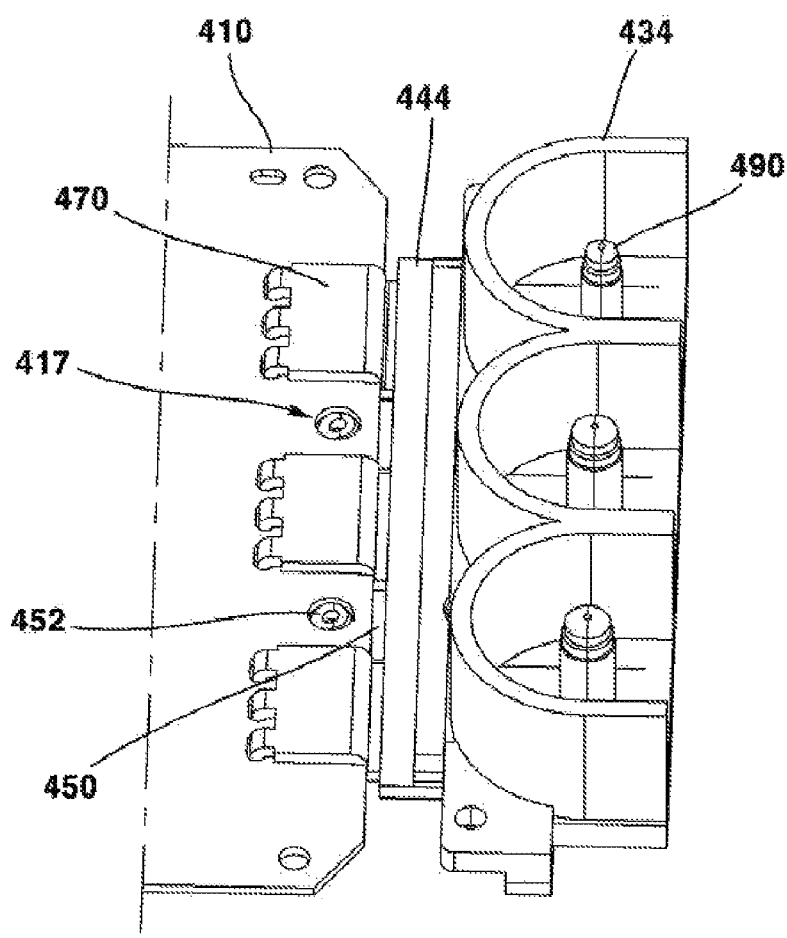
FIG. 23 is a perspective view illustrating a coupling state between a connector module and a printed circuit board according to a fourth embodiment of the present invention.
Figure 24:
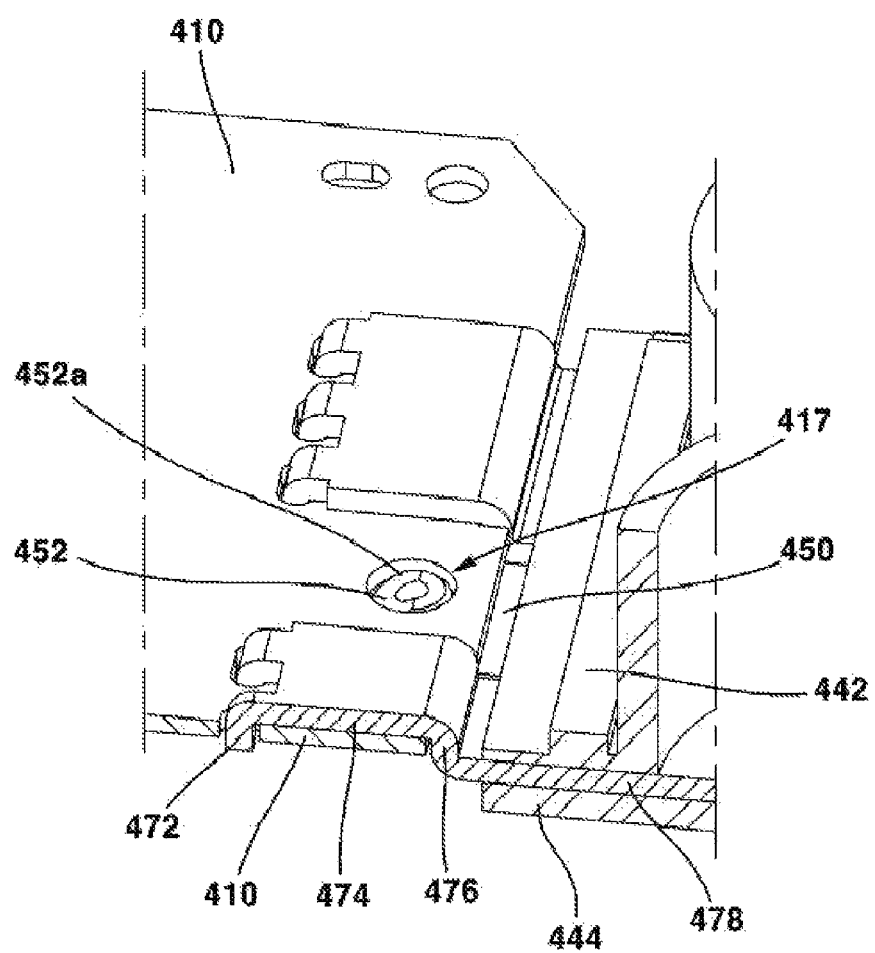
FIG. 24 is a view illustrating a portion of FIG. 23 cut open.
Figure 25:
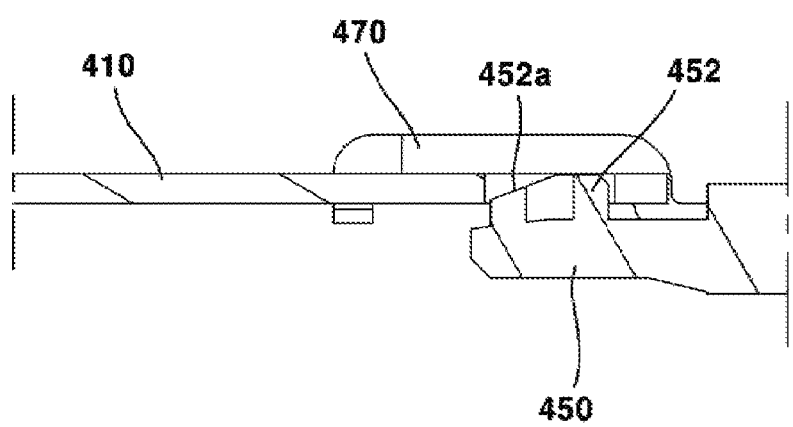
FIG. 25 is a cross-sectional view illustrating a coupling state between a connector module and a printed circuit board according to a fourth embodiment of the present invention.

FIG. 21 is an exploded perspective view of a converter according to a fourth embodiment of the present invention, FIG. 22 is an exploded perspective view of FIG. 21 from another angle, FIG. 23 is a perspective view illustrating a coupling state between a connector module and a printed circuit board according to a fourth embodiment of the present invention, FIG. 24 is a view illustrating a portion of FIG. 23 cut open, and FIG. 25 is a cross-sectional view illustrating a coupling state between a connector module and a printed circuit board according to a fourth embodiment of the present invention.

In the present embodiment, other parts are the same as in the first embodiment, but there is a difference in the coupling structure of the connector module and the printed circuit board. Therefore, in the following, only the characteristic parts of the present embodiment will be described, and in the remaining parts, the description of the first embodiment will be cited.

Referring to FIGS. 21 to 25, the connector module 430 according to the present embodiment may also include a bracket 431, a first body 444 and a second body 438. In addition, the bus bar 470 may form a coupling structure with the printed circuit board 410 through the bent part 476, the upper plate part 474, and the connection part 472.

Meanwhile, it is also the same as the first embodiment in that a coupling groove 411 for coupling the bus bar 470 is formed on a side surface of the printed circuit board 410. Accordingly, at least a portion of the bent part 476 may be disposed in the coupling groove 411, and a side surface of the bent part 476 may be supported by an inner surface of the coupling groove 411. Accordingly, it has been described in a first embodiment that the coupling force between the bus bar 470 and the printed circuit board 410 can be enhanced.

In the present embodiment, in order to firmly fix the printed circuit board 410 and the connector module 430, the connector module 430 may include a fifth guide part 450. The fifth guide part 450 is disposed to be protruded inward from the first body 444, and may support a lower surface of the printed circuit board 410. The fifth guide part 450 may be formed integrally with the bracket 431. An upper surface of the fifth guide part 450 may be disposed to face a lower surface of the printed circuit board 410. An upper surface of the fifth guide part 450 may be in contact with a lower surface of the printed circuit board 410.

The fifth guide part 450 is provided in plurality and may be disposed to be spaced apart from each other. The fifth guide part 450 may be disposed between the plurality of bus bars 470. For example, the fifth guide part 450 may be disposed between the first bus bar 470a and the second bus bar 470b and between the second bus bar 470b and the third bus bar 470c.

A guide protrusion 452 being protruded upward may be formed on an upper surface of the fifth guide part 450. The guide protrusion 452 may be formed to have a circular cross-section. In order to facilitate sliding movement along a lower surface of the printed circuit board 410, an inclined surface 452a having a shape in which the height from the upper surface of the fifth guide part 450 increases as it travels toward the outer side may be formed on an upper surface of the guide protrusion 452.

The printed circuit board 410 is formed to penetrate through the lower surface from the upper surface, and a guide hole 417 to which the guide protrusion 452 is coupled when the connector module 430 is coupled, may be formed. Specifically, when the connector module 430 and the printed circuit board 410 are coupled, the guide protrusion 452 may be inserted into the guide hole 417 as the fifth guide part 450 is slidably moved along a lower surface of the printed circuit board 410. The height of the guide protrusion 452 from an upper surface of the fifth guide part 450 may be formed to be longer than a thickness of the printed circuit board 410. Accordingly, the guide protrusion 452 may be protruded upward by a predetermined distance from the printed circuit board 410.

Therefore, due to the coupling structure between the guide protrusion 452 and the guide hole 417 in the plurality of fifth guide parts 450, the connector module 430 is inhibited from being flowing in a direction parallel to the printed circuit board 410, and a coupling state with the printed circuit board 110 may be firmly maintained.

Figure 26:
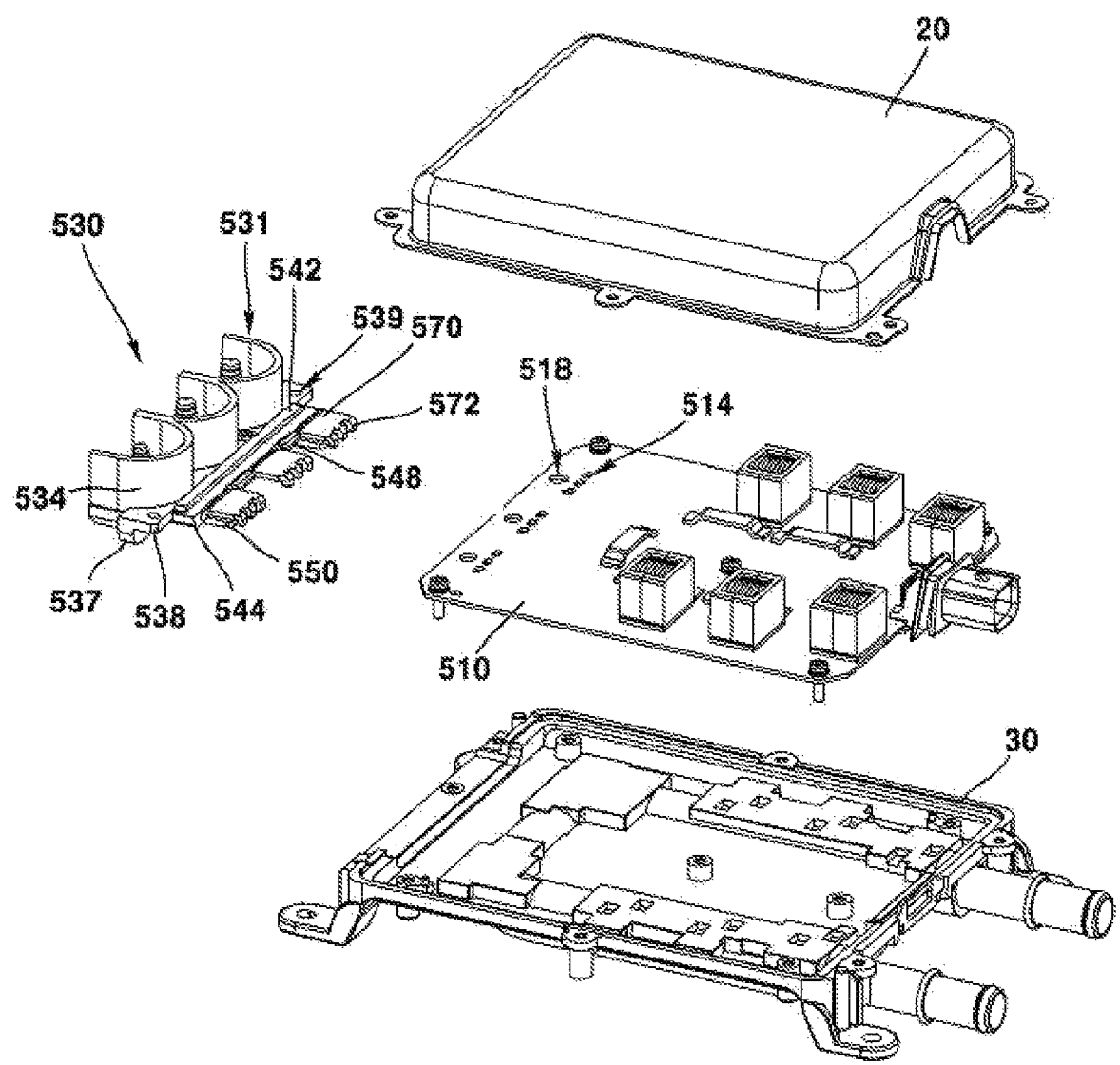
FIG. 26 is an exploded perspective view of a converter according to a fifth embodiment of the present invention.
Figure 27:
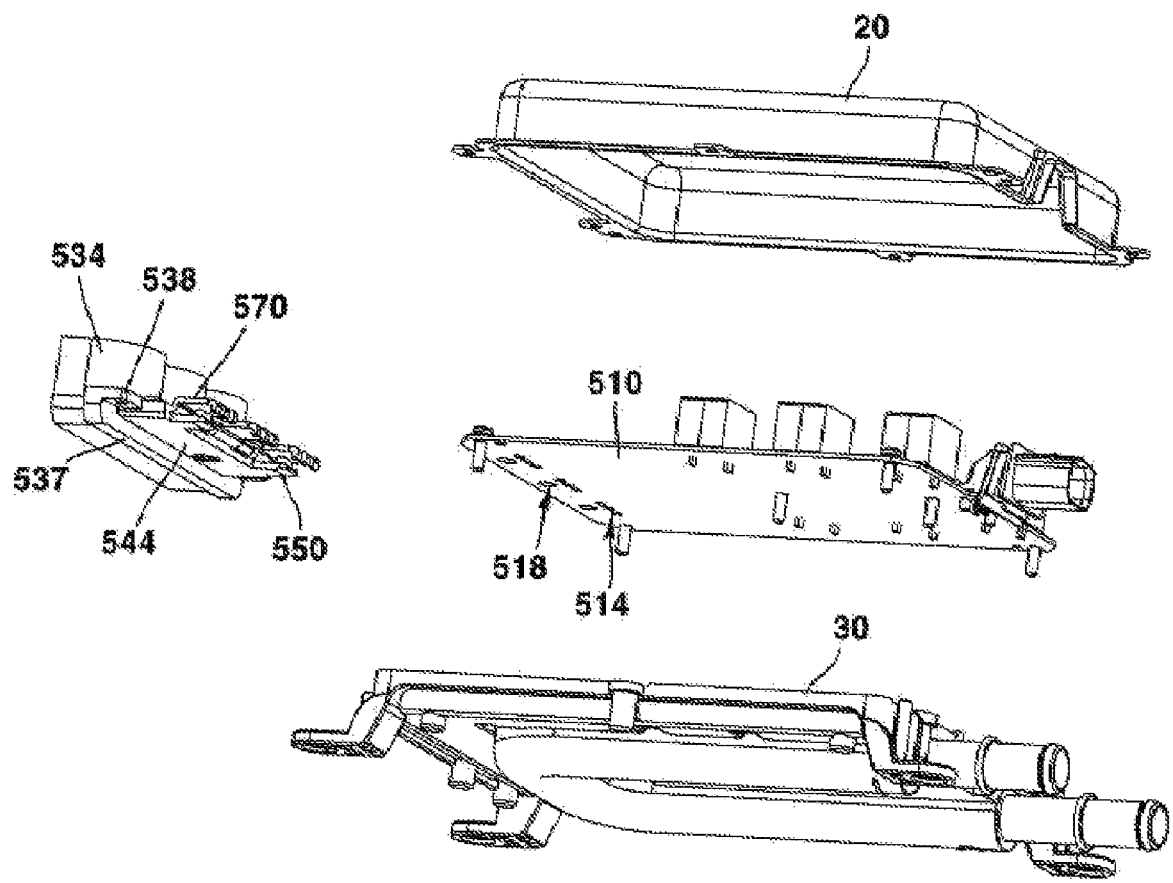
FIG. 27 is an exploded perspective view illustrating FIG. 26 from another angle.
Figure 28:
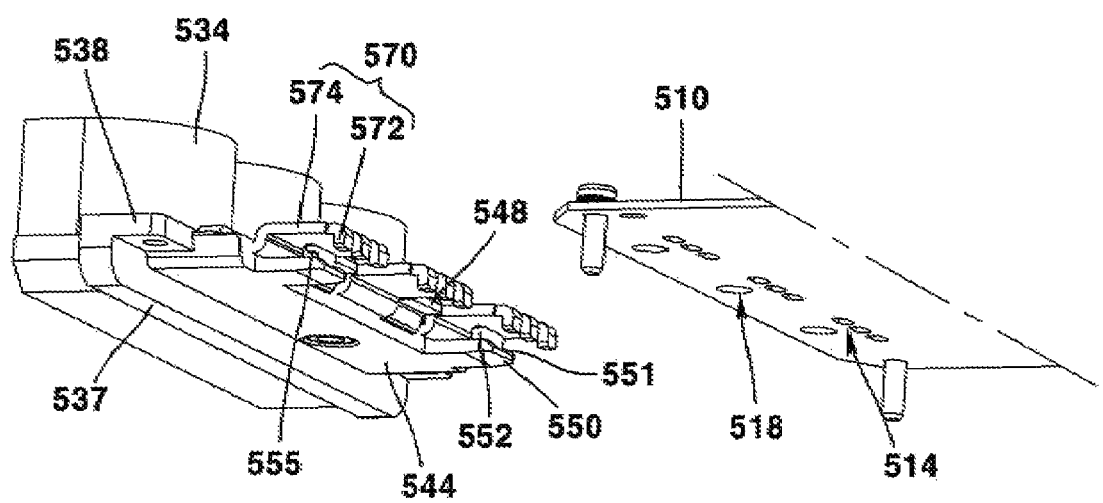
FIG. 28 is an exploded perspective view of a connector module and a printed circuit board according to a fifth embodiment of the present invention.

FIG. 26 is an exploded perspective view of a converter according to a fifth embodiment of the present invention, FIG. 27 is an exploded perspective view illustrating FIG. 26 from another angle, and FIG. 28 is an exploded perspective view of a connector module and a printed circuit board according to a fifth embodiment of the present invention.

In the present embodiment, other parts are the same as in the first embodiment, but there is a difference in the coupling structure of the connector module and the printed circuit board. Therefore, in the following, only the characteristic parts of the present embodiment will be described, and in the remaining parts, the description of the first embodiment will be cited.

Referring to FIGS. 26 to 28, the connector module 530 according to the present embodiment may also include a bracket 531, a first body 544, and a second body 538. In addition, the bus bar 570 may form a coupling structure with the printed circuit board 510 through the bent part, the upper plate part, and the connection part.

In order to firmly fix the printed circuit board 510 and the connector module 530, the connector module 530 may include a sixth guide part 550 and a seventh guide part 548. The sixth guide part 550 is disposed to be protruded inward from the first body 544, and may support a lower surface of the printed circuit board 510. The sixth guide part 550 may be disposed below the bus bar 570. The sixth guide part 550 may be disposed to be overlapped with the bus bar 570 in an up and down direction. A separation space 555 may be formed between the sixth guide part 550 and the bus bar 570 so that the printed circuit board 510 is coupled thereto.

The sixth guide part 550 is provided in plurality, and may be disposed below each of the plurality of bus bars 570.

The bus bar 570 may be formed to have a length being protruded from the end portion of the first body 544 to be longer than that of the sixth guide part 550.

An upper surface of the sixth guide part 550 may face a lower surface of the printed circuit board 510. An upper surface of the sixth guide part 550 may be in contact with a lower surface of the printed circuit board 510. An inclined surface 551 having a shape in which the thickness of the sixth guide part 550 becomes thinner as it travels toward the inner side thereof may be formed on an upper surface of the sixth guide part 550. Accordingly, when the connector module 530 and the printed circuit board 510 are coupled, the sixth guide part 550 may be easily slidably moved to a lower surface of the printed circuit board 510.

A guide protrusion 552 being protruded upward may be formed on an upper surface of the sixth guide part 550. The guide protrusion 552 may have a circular or elliptical cross-section. An upper surface of the guide protrusion 552 may be spaced apart from a lower surface of the bus bar 570 by a predetermined distance. An inclined surface may also be formed on the upper surface of the guide protrusion 552.

A guide hole 518 may be formed in the printed circuit board 510 to penetrate through a lower surface from an upper surface, and into which the guide protrusion 552 is coupled when the connector module 530 is coupled. With respect to the terminal hole 514 to which the connection part 572 of the bus bar 570 is coupled, the guide hole 518 may be disposed on an outer side of the terminal hole 514.

When the connector module 530 and the printed circuit board 510 are coupled, the guide protrusion 552 may be coupled to the guide hole 518, as the fifth guide part 550 is slidably moved along a lower surface of the printed circuit board 510. Therefore, due to the coupling structure between the guide protrusion 552 and the guide hole 518 in the plurality of sixth guide parts 550, the connector module 530 is inhibited from being flowing in a direction parallel to the printed circuit board 510, and the coupling state with the printed circuit board 510 may be firmly maintained.

The seventh guide part 548 may be protruded inward from the first body 544 and be disposed on the printed circuit board 510. A plurality of the seventh guide part 548 may be provided and disposed between the plurality of bus bars 570. A lower surface of the seventh guide part 548 may be in contact with an upper surface of the printed circuit board 510 or may be spaced apart from each other by a predetermined distance. An upper surface of the seventh guide part 548 may be disposed above an upper surface of the upper plate part 574. An inclined surface or a curved surface for easy sliding of the printed circuit board 510 may be formed on a lower surface of the seventh guide part 548 as well.

Accordingly, since a lower surface of the printed circuit board 510 is supported by the sixth guide part 550, and un upper surface of the printed circuit board 510 is supported by a lower surface of the seventh guide part 548, the connector module 530 is inhibited from being flowing in both an up and down direction perpendicular to the printed circuit board 510 and a left and right direction parallel to the printed circuit board 510, and the coupling state with the printed circuit board 510 can be firmly fixed.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. A connector module coupled to a printed circuit board including a terminal hole, the connector module comprising:
    a bracket including a first body and a second body;
    a bus bar disposed in the bracket and protruded outside the first body;
    a pin disposed in the second body and connected to the bus bar;
    a first guide part protruded from the first body and supporting a lower surface of the printed circuit board; and a second guide part protruded from the first body and supporting an upper surface of the printed circuit board, wherein the bus bar comprises:
an upper plate part disposed on an upper surface of the printed circuit board;
a connection part bent from one end of the upper plate part and coupled to the terminal hole; and
a bent part bent from an other end of the upper plate part and surrounding a side surface of the printed circuit board.

2. The connector module according to claim 1, wherein a first guide protrusion protruded upward is disposed on an upper surface of the first guide part, and
wherein the printed circuit board comprises a guide hole configured as to penetrate through a lower surface from an upper surface and to which the first guide protrusion is coupled.

3. The connector module according to claim 2, wherein an inclined surface is formed on an upper surface of the first guide protrusion.

4. The connector module according to claim 1, wherein a coupling groove is disposed in a region in which the bent part is disposed among the side surface of the printed circuit board, and
wherein a side surface of the bent part faces an inner surface of the coupling groove.

5. The connector module according to claim 1, wherein the bus bar includes a first bus bar, a second bus bar, and a third bus bar that are spaced apart from each other,
wherein the first guide part is provided in plurality and is respectively disposed on both sides of the bus bar, and
wherein the second guide part is provided in plurality and is disposed between the first bus bar and the second bus bar and between the second bus bar and the third bus bar, respectively.

6. A connector module coupled to a printed circuit board including a terminal hole, the connector module comprising:
a bracket including a first body and a second body;
a bus bar disposed in the bracket and protruded outside the first body;
a third guide part protruded from the first body and supporting the lower surface of the printed circuit board; and
a pin disposed in the second body and connected to the bus bar,
wherein the bus bar comprises:
an upper plate part disposed on an upper surface of the printed circuit board;
a connection part bent from one end of the upper plate part and coupled to the terminal hole; and
a bent part bent from an other end of the upper plate part and surrounding a side surface of the printed circuit board,
wherein on an upper surface of the third guide part is an inclined surface having a shape in which a vertical distance to a lower surface of the printed circuit board decreases as it travels toward an outer side of the printed circuit board.

7. The connector module according to claim 6, including:
a guide rib disposed on an outer side of the bus bar and disposed on an upper surface of the first body,
wherein a hole is disposed on a lower surface of the printed circuit board so that the guide rib is coupled thereto.

8. A connector module coupled to a printed circuit board including a terminal hole, the connector module comprising:
a bracket including a first body and a second body;
a bus bar disposed in the bracket and protruded outside the first body;
a fourth guide part protruded from the first body and coupled to the printed circuit board; and
a pin disposed in the second body and connected to the bus bar,
wherein the bus bar comprises:
an upper plate part disposed on an upper surface of the printed circuit board;
a connection part bent from one end of the upper plate part and coupled to the terminal hole; and
a bent part bent from an other end of the upper plate part and surrounding a side surface of the printed circuit board,
wherein the fourth guide part includes:
a guide groove accommodating a side surface of the printed circuit board;
an upper region disposed at an upper portion with respect to the guide groove, a lower surface facing the upper surface of the printed circuit board; and
a lower region disposed at a lower portion with respect to the guide groove and having an upper surface facing a lower surface of the printed circuit board.

9. The connector module according to claim 8, wherein the bus bar includes a first bus bar, a second bus bar, and a third bus bar that are spaced apart from each other, and
wherein the fourth guide part is provided in plurality and is respectively disposed between the first bus bar and the second bus bar and between the second bus bar and the third bus bar.

10. A connector module coupled to a printed circuit board including a terminal hole, the connector module comprising:
a bracket including a first body and a second body;
a bus bar disposed in the bracket and protruded outside the first body;
a fifth guide part protruded from the first body and supporting a lower surface of the printed circuit board; and
a pin disposed in the second body and connected to the bus bar,
wherein the bus bar comprises:
an upper plate part disposed on an upper surface of the printed circuit board;
a connection part bent from one end of the upper plate part and coupled to the terminal hole; and
a bent part bent from an other end of the upper plate part and surrounding a side surface of the printed circuit board
wherein a fifth guide protrusion is disposed on an upper surface of the fifth guide part,
wherein the printed circuit board includes a hole to which the fifth guide protrusion is coupled, and
wherein an inclined surface is disposed on an upper surface of the fifth guide protrusion.

11. The connector module according to claim 10, including:
a sixth guide part protruded from the first body and supporting a lower surface of the printed circuit board,
wherein the sixth guide part is disposed below the bus bar.

12. The connector module according to claim 11, wherein a sixth guide protrusion protruding upward is disposed on an upper surface of the sixth guide part, and
wherein a guide hole to which the sixth guide protrusion is coupled is disposed on the printed circuit board.

13. The connector module according to claim 12, wherein the sixth guide part is provided in plurality and is disposed to be spaced apart from each other, and wherein a seventh guide part is disposed between the adjacent sixth guide parts, and a lower surface supports an upper surface of the printed circuit board.

14. The connector module according to claim 10, wherein the bus bar includes a first bus bar, a second bus bar, and a third bus bar that are spaced apart from each other, and
wherein the fifth guide part is provided in plurality and is respectively disposed between the first bus bar and the second bus bar and between the second bus bar and the third bus bar.

15. A converter comprising:
a housing including a base and a cover disposed on an upper portion of the base;
a printed circuit board disposed in the housing and including a terminal hole; and
a connector module that is coupled to the printed circuit board and at least a part thereof is disposed in the housing through a hole disposed on a side surface of the housing,
wherein the connector module includes:
a bracket including a first body disposed in the housing and a second body disposed outside the housing;
a bus bar that is disposed in the bracket and at least a portion thereof is protruded toward an outer side of the first body and coupled to the printed circuit board; and
a pin disposed in the second body and connected to the bus bar, and
wherein the bus bar includes:
an upper plate part disposed on an upper surface of the printed circuit board;
a connection part bent from one end of the upper plate part and coupled inside the terminal hole; and
a bent part bent from an other end of the upper plate part and surrounding a side surface of the printed circuit board.

16. The converter according to claim 15, wherein the hole of the housing is formed by combining the base and the cover, and
wherein a sealing member is disposed between the hole of the housing and the first body.

17. The converter according to claim 15, wherein the bracket is screwed onto the base.

18. The converter according to claim 15, wherein a material of the bracket is plastic, and
wherein the bus bar and the bracket are integrally formed by insert injection molding.

19. The converter according to claim 15, wherein a guide part protrudes from the outer surface of the first body and supports the upper or lower surface of the printed circuit board.

* * * * *